(12) United States Patent
Nakazawa et al.

(10) Patent No.: US 9,667,226 B2
(45) Date of Patent: May 30, 2017

(54) SURFACE ACOUSTIC WAVE DEVICE AND FILTER WITH ADDITIONAL COVERING FILMS

(71) Applicant: TAIYO YUDEN CO., LTD., Tokyo (JP)

(72) Inventors: Hidetaro Nakazawa, Tokyo (JP); Kentaro Nakamura, Tokyo (JP); Shogo Inoue, Tokyo (JP); Jun Tsutsumi, Tokyo (JP); Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 143 days.

(21) Appl. No.: 14/572,246

(22) Filed: Dec. 16, 2014

(65) Prior Publication Data
US 2015/0180451 A1  Jun. 25, 2015

(30) Foreign Application Priority Data

Dec. 19, 2013 (JP) .................................. 2013-262903

(51) Int. Cl.
*H03H 9/64* (2006.01)
*H03H 9/02* (2006.01)
(Continued)

(52) U.S. Cl.
CPC ............ *H03H 9/6489* (2013.01); *H03H 3/08* (2013.01); *H03H 9/02881* (2013.01);
(Continued)

(58) Field of Classification Search
CPC .. H03H 9/02858; H03H 9/02881; H03H 9/25; H03H 9/14538; H03H 9/14541;
(Continued)

(56) References Cited

U.S. PATENT DOCUMENTS

2002/0057036 A1   5/2002  Taniguchi et al.
2004/0251990 A1  12/2004  Ueda et al.
(Continued)

FOREIGN PATENT DOCUMENTS

JP      7-115342 A    5/1995
JP   2002-100952 A    4/2002
(Continued)

*Primary Examiner* — Robert Pascal
*Assistant Examiner* — Jorge Salazar, Jr.
(74) *Attorney, Agent, or Firm* — Chen Yoshimura LLP

(57) ABSTRACT

A surface acoustic wave device includes: a pair of comb-type electrodes that are provided on a piezoelectric substrate and include electrode fingers and dummy electrode fingers, the electrode fingers of one of the pair of comb-type electrodes facing the dummy electrode fingers of the other comb-type electrode; and additional films that are provided to cover gaps between tip ends of the electrode fingers and tip ends of the dummy electrode fingers and to overlap with at least one of first through third groups in which the first and second groups respectively include the electrode fingers and the dummy electrode fingers located at opposite sides of the gaps in a first direction in which the electrode fingers extend, and the third group includes the electrode fingers located at sides of the gaps in a second direction that crosses the first direction.

17 Claims, 24 Drawing Sheets

(51) Int. Cl.
*H03H 9/145* (2006.01)
*H03H 3/08* (2006.01)

(52) U.S. Cl.
CPC .... *H03H 9/02889* (2013.01); *H03H 9/02944* (2013.01); *H03H 9/02952* (2013.01); *H03H 9/14541* (2013.01)

(58) Field of Classification Search
CPC .... H03H 9/6489; H03H 3/08; H03H 9/02889; H03H 9/02994; H03H 9/02952
USPC .......................................... 333/133, 193–196
See application file for complete search history.

(56) References Cited

U.S. PATENT DOCUMENTS

| | | | |
|---|---|---|---|
| 2011/0068655 A1* | 3/2011 | Solal | H03H 9/02858 310/313 B |
| 2011/0215884 A1* | 9/2011 | Fujiwara | H03H 9/64 333/195 |
| 2012/0161577 A1 | 6/2012 | Abbott et al. | |
| 2014/0001919 A1* | 1/2014 | Komatsu | H03H 9/02818 310/313 B |
| 2014/0285287 A1* | 9/2014 | Komatsu | H03H 9/25 333/195 |

FOREIGN PATENT DOCUMENTS

| | | | |
|---|---|---|---|
| JP | 2004-328196 A | | 11/2004 |
| JP | 2007-110342 A | | 4/2007 |
| JP | 2009-278429 A | | 11/2009 |
| JP | 2009-290472 | * | 12/2009 |
| JP | 2012-186808 A | | 9/2012 |

* cited by examiner

FIRST DIRECTION

SECOND DIRECTION

FIRST DIRECTION

SECOND DIRECTION

FIRST DIRECTION
SECOND DIRECTION

FIRST DIRECTION

SECOND DIRECTION

FIRST DIRECTION
SECOND DIRECTION

SURFACE ACOUSTIC WAVE DEVICE AND FILTER WITH ADDITIONAL COVERING FILMS

CROSS-REFERENCE TO RELATED APPLICATION

This application is based upon and claims the benefit of priority of the prior Japanese Patent Application No. 2013-262903, filed on Dec. 19, 2013, the entire contents of which are incorporated herein by reference.

FIELD

A certain aspect of the present invention relates to surface acoustic wave devices and filters.

BACKGROUND

As an acoustic wave device using an acoustic wave, there is known a surface acoustic wave (SAW) device including an interdigital transducer (IDT) composed of a pair of comb-type electrodes formed on a piezoelectric substrate and a pair of reflectors between which the IDT is interposed. The SAW device is used in, for example, a band-pass filter in various circuits that process RF (radio frequency) signals in a frequency band of 45 MHz~2 GHz, which is typical in cellular phones. Recently, due to the increasing performance of RF communications devices that are typically cellular phones (for example, multiband and multimode), there has been a growing demand for reducing the insertion loss of filters in order to achieve improvement in the receive sensitivity of RF communication devices, power consumption reduction and the like.

Various acoustic wave devices intended to reduce power consumption have been proposed. For example, there is a proposed structure in which the thickness of part of a bus bar is larger than that of electrode fingers (see Japanese Laid-Open Patent Application Nos. 2004-328196 and 2002-100952, for example). There is another proposed structure in which a protection film that covers IDT is thick in positions where electrode fingers are interleaved, as compared to other positions (see Japanese Laid-Open Patent Application No. 2007-110342, for example). There is still another proposed structure in which tips of electrode fingers are widened or a metal film is added to the tips (see Japanese Laid-Open Patent Application No. 2012-186808, for example). There is a further proposed structure in which an in insulator is buried between tips of electrode fingers and those of dummy electrode fingers (see Japanese Laid-Open Patent Application No. 2009-278429, for example). There is a still further proposed structure in which a film having a substance different from that of electrode fingers is provided between adjacent electrode fingers (see Japanese Laid-Open Patent Application No. 7-115342).

However, there is room for improvement in terms of reduction in insertion loss. The proposed structure in which the protection film that covers IDT is thick in positions where the electrode fingers are interleaved, as compared to other positions (see Japanese Laid-Open Patent Application No. 2007-110342) affects performance such as reduction of the electromechanical coupling coefficient. This publication discloses a method for forming the difference in the thickness of the protection film by etching. However, this method is likely to have frequency deviations and has difficulty in manufacturing. Similarly, the structure in which the metal film is added to the tips of the electrode fingers (see Japanese Laid-Open Patent Application No. 2012-186808) has adverse effects on the performance such as reduction of the electromechanical coupling coefficient.

SUMMARY OF THE INVENTION

According to an aspect of the present invention, there is provided a surface acoustic wave device and a filter having improved insertion loss.

According to another aspect of the present invention, there is provided a surface acoustic wave device including: a pair of comb-type electrodes that are provided on a piezoelectric substrate and include electrode fingers and dummy electrode fingers, the electrode fingers of one of the pair of comb-type electrodes facing the dummy electrode fingers of the other comb-type electrode; and additional films that are provided to cover gaps between tip ends of the electrode fingers and tip ends of the dummy electrode fingers and to overlap with at least one of first through third groups in which the first and second groups respectively include the electrode fingers and the dummy electrode fingers located at opposite sides of the gaps in a first direction in which the electrode fingers extend, and the third group includes the electrode fingers located at sides of the gaps in a second direction that crosses the first direction.

According to yet another aspect of the present invention, there is provided a surface acoustic wave device including: a pair of comb-type electrodes that are provided on a piezoelectric substrate and include electrode fingers and bus bars, the electrode fingers of one of the pair of comb-type electrodes facing one of the bus bars of the other comb-type electrode; and additional films that are provided to cover gaps between tip ends of the electrode fingers and sides of the bus bars and to overlap with at least one of first through third groups in which the first and second groups respectively include the electrode fingers and the bus bars located at opposite sides of the gaps in a first direction in which the electrode fingers extend, and the third group includes the electrode fingers located at sides of the gaps in a second direction that crosses the first direction.

According to a further aspect of the present invention, there is provided a filter including an input terminal, an output terminal and resonators connected between the input and output terminals, at least one of the resonators including a surface acoustic wave device as described above.

DETAILED DESCRIPTION

Embodiments are now described below with reference to the drawings.

First Embodiment

Figure 1A:
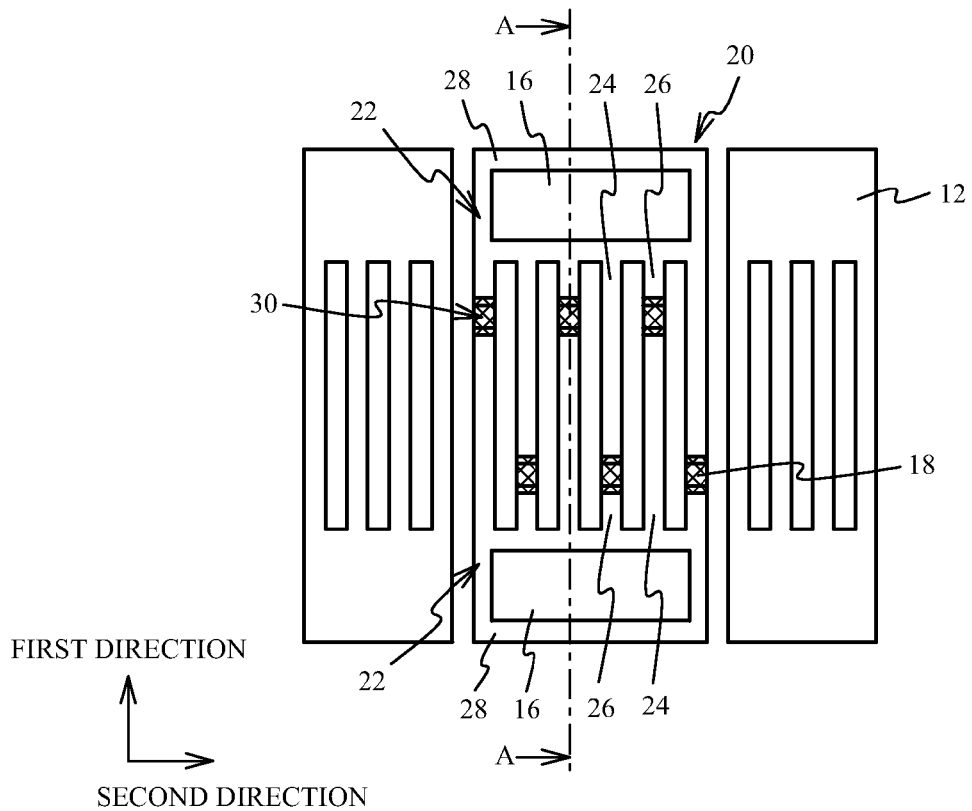
FIG. 1A is a top view of a SAW device in accordance with a first embodiment.
Figure 1B:
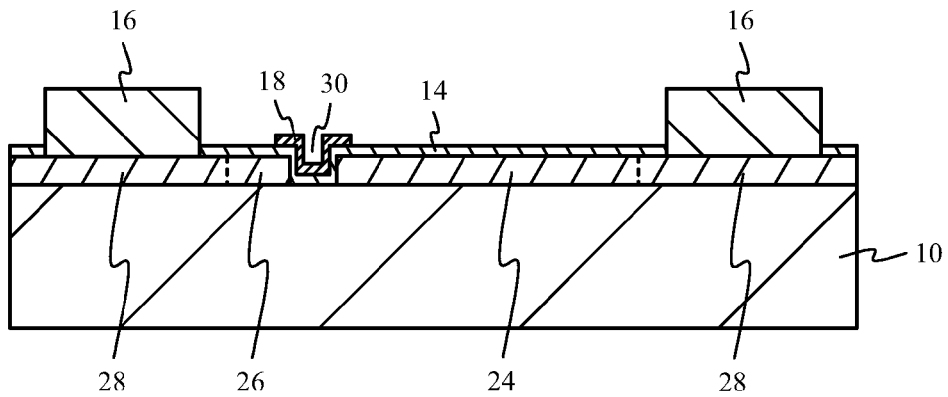
FIG. 1B is a cross-sectional view taken along a line A-A in FIG. 1A.

FIG. 1A is a top view of a SAW device in accordance with a first embodiment, and FIG. 1B is a cross-sectional view taken along a line A-A in FIG. 1A. In FIG. 1A, the device is seen through a protection film. Referring to FIGS. 1A and 1B, on a piezoelectric substrate 10, there are provided an IDT 20, and reflectors 12, which are located at both sides of the IDT in a direction of propagation of acoustic waves. The piezoelectric substrate 10 may be made of a piezoelectric material such as lithium niobate or lithium tantalate. The IDT 20 and the reflectors 12 may be made of a metal such as aluminum, copper or the like. The IDT 20 includes a pair of comb-type electrodes 22. Each of the pair of comb-type electrodes 22 includes a plurality of electrode fingers 24, a plurality of dummy electrode fingers 26, and bus bars 28 to which the electrode fingers 24 and the dummy electrode fingers 26 are connected. The dummy electrode fingers 26 are provided between the electrode fingers 24, for example. The electrode fingers 24 of one of the pair of comb-type electrodes and the electrode fingers 24 of the other are interleaved with each other.

Except parts of the bus bars 28, the IDT 20 and the reflectors 12 are covered with a protection film 14. The protection film 14 may be made of a dielectric film such as silicon oxide or the like. The thickness of the protection film 14 is, for example, approximately one tenth of the thickness of the IDT 20. A metal film 16 is provided on the parts of the bus bars 28 that are not covered with the protection film 14.

The pair of comb-type electrodes 22 are arranged so that the electrode fingers 24 of one of the pair of comb-type electrodes 22 face the dummy electrode fingers 26 of the other comb-type electrode 22. With this arrangement, gaps 30 are defined between the tip ends of the electrode fingers 24 and the tip ends of the corresponding dummy electrode fingers 26. A plurality of additional films 18 are provided on the protection film 14 so as to cover the gaps 30 and overlap with parts of the electrode fingers 24 and parts of the dummy electrode fingers 26 that are located at opposite sides of the gaps 30 in a direction in which the electrode fingers 24 extend. The additional films 18 do not overlap with the electrode fingers 24 that are located at sides of the gaps 30 in a second direction that crosses the first direction. The first and second directions cross each other at right angles, for example. The additional films 18 may be films that include any of tantalum oxide, aluminum oxide, silicon oxide, silicon nitride, aluminum nitride, silicon carbide, titanium oxide, silicon and diamond, or metal films that include that include titanium (Ti), gold (Au), copper (Cu), chrome (Cr), nickel (Ni), platinum (Pt), tantalum (Ta), tungsten (W), ruthenium (Ru), molybdenum (Mo) or the like. Although the additional films 18 have a rectangular shape in FIG. 1A, the additional films 18 may have a shape other than the rectangular shape such as a circular shape, an elliptical shape, or the like.

Figure 2A:
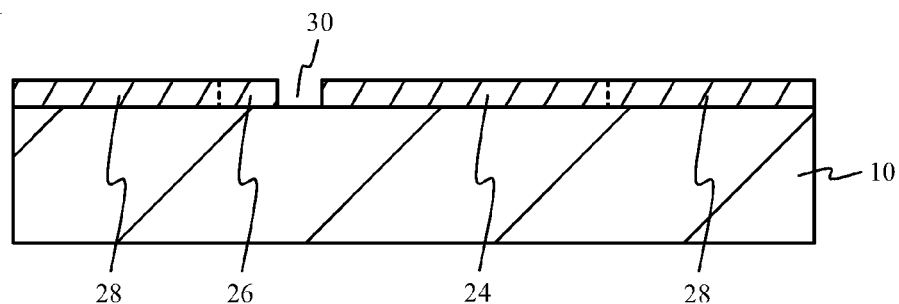
FIGS. 2A through 2D are cross-sectional views that illustrate a method for fabricating the SAW device of the first embodiment.

A description is now given of a method for fabricating the SAW device in accordance with the first embodiment. FIGS. 2A through 2D and FIGS. 3A through 3C are cross-sectional views that illustrate a first method for fabricating the SAW device in accordance with the first embodiment. As illustrated in FIG. 2A, a metal film is deposited on the piezoelectric substrate 110, and is shaped into the IDT 20 and the reflectors 12 by an exposure technique and an etching technique, for example. As described previously, the IDT 20 is made up of a pair of comb-type electrodes 22, each including the electrode fingers 24, the dummy electrode fingers 26 and the bus bar 28. The gaps 30 are formed between the tip ends of the electrode fingers 24 and those of the dummy electrode fingers 26.

Figure 2B:
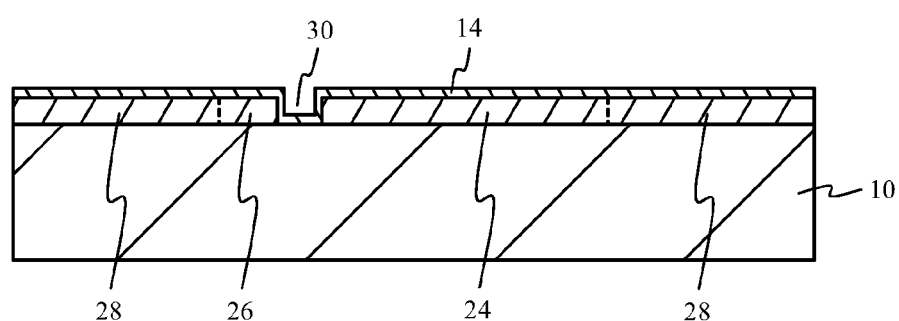
Figure 2C:
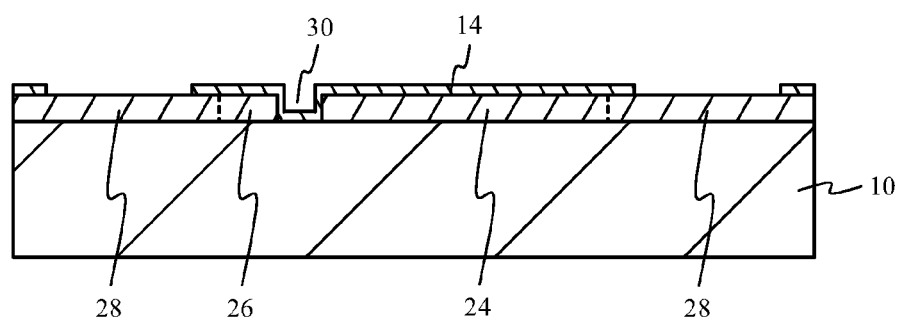
Figure 2D:
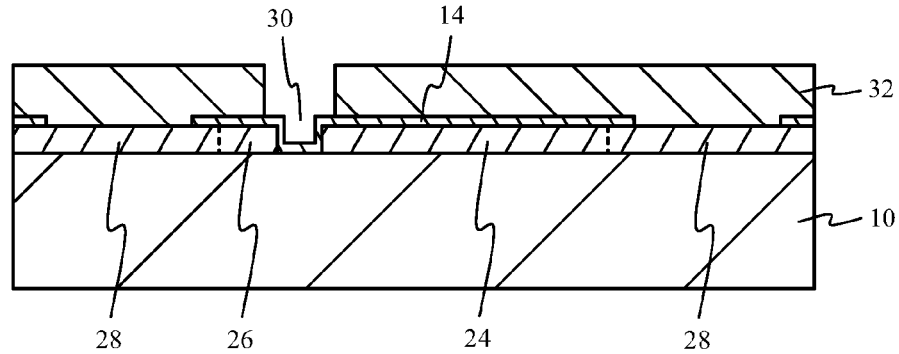

Referring to FIG. 2B, the protection film 14 is deposited on the entire surface by sputtering, for example. As illustrated in FIG. 2C, by using the exposure technique and the etching technique, for example, the protection film 14 is removed from areas in which the metal film 16 is to be formed. As illustrated in FIG. 2D, a resist film 32 is formed on the entire surface, and is removed from areas in which the additional films 18 are to be formed, whereby openings are formed.

Figure 3A:
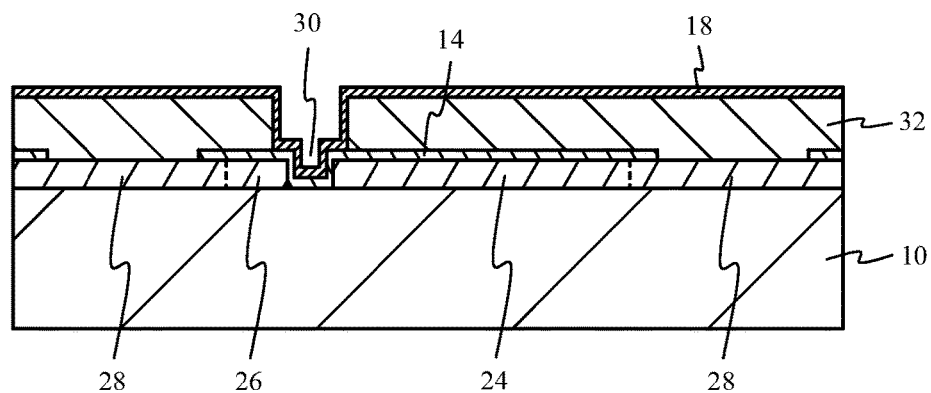
FIGS. 3A through 3C are cross-sectional views that illustrate steps that follow those of the method illustrated in FIGS. 2A through 2D.
Figure 3B:
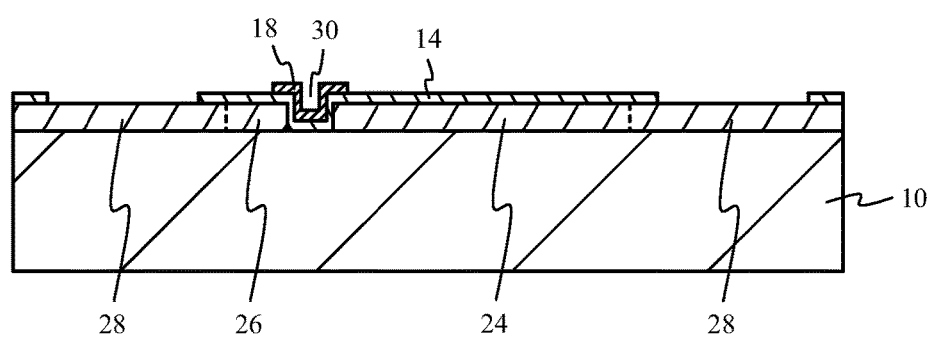
Figure 3C:
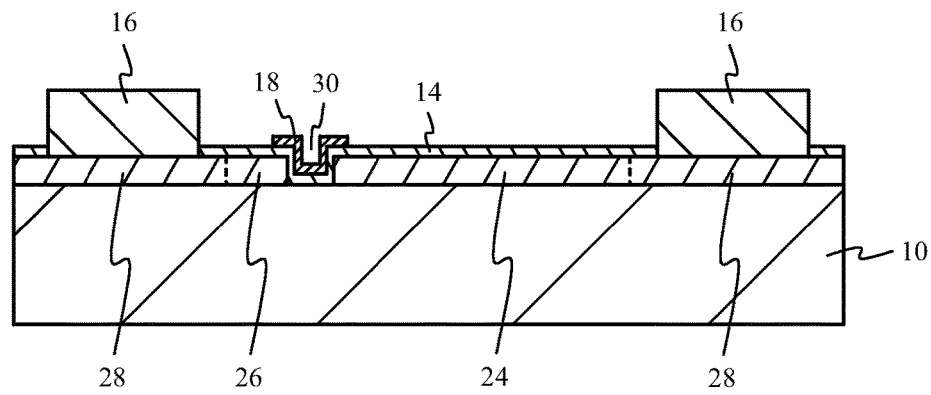

As illustrated in FIG. 3A, the additional film 18 is deposited on the entire surface by sputtering, for example. As illustrated in FIG. 3B, the resist film 32 is removed by liftoff and the additional film 18 is thus patterned. Since the additional films 18 may be formed by the steps based on the lithography technique, the additional films 18 and the corresponding gaps 30 may be aligned with a precision of 0.1 µm or less. It is thus possible to control the amount of covering with the additional films 18 for the electrode fingers 24 and the dummy electrode fingers 26 located at the opposite sides of the gaps in the first direction with a management value. It is also possible to control, with a management value, the amount of protrusion of the additional films 18 in the second direction from the side surfaces of the electrode fingers 24 and the dummy electrode fingers 26 located at the opposite sides of the gaps 30 in the first direction. As illustrated in FIG. 3C, the metal film 16 is formed on the bus bars 28 by an evaporation method and liftoff. The SAW device of the first embodiment is manufactured by the process including the above-described steps.

Figure 4A:
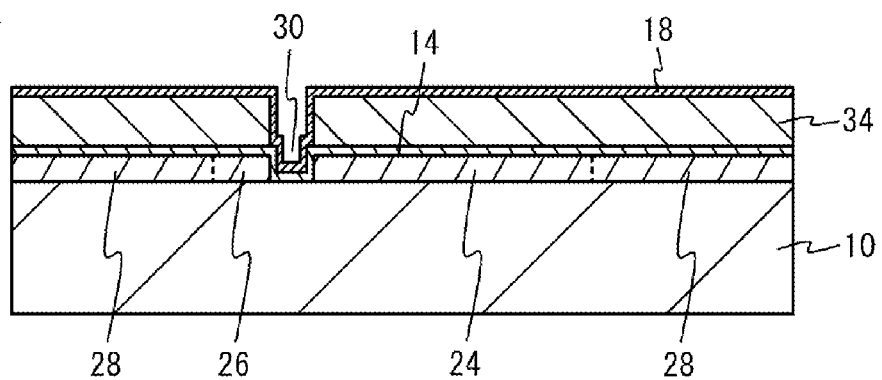
FIGS. 4A through 4D are cross-sectional views that illustrate a second method for fabricating the SAW device of the first embodiment.
Figure 4B:
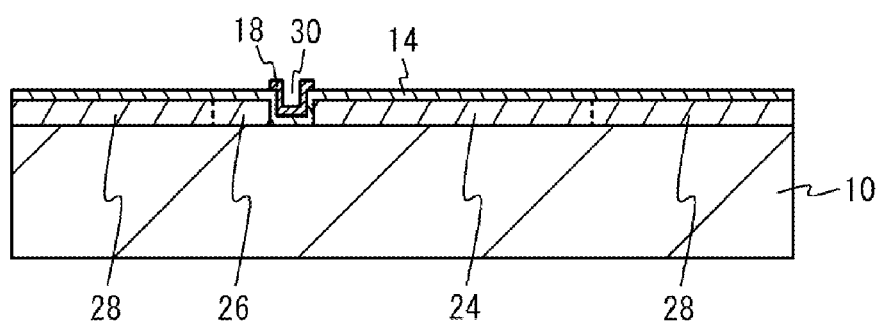

FIGS. 4A through 4D are cross-sectional views that illustrate a second method for fabricating the SAW device according to the first embodiment. After the protective film 14 is deposited on the whole surface by performing the steps of FIGS. 2A and 2B, as illustrated in FIG. 4A, formed is a resist film 34 having openings located in positions where the additional films 18 are to be formed. Then, the film which is to be patterned into the additional films 18 is deposited on the whole surface by sputtering. Referring to FIG. 4B, the film is patterned into the additional films 18 by removing the resist film 34 by liftoff.

Figure 4C:
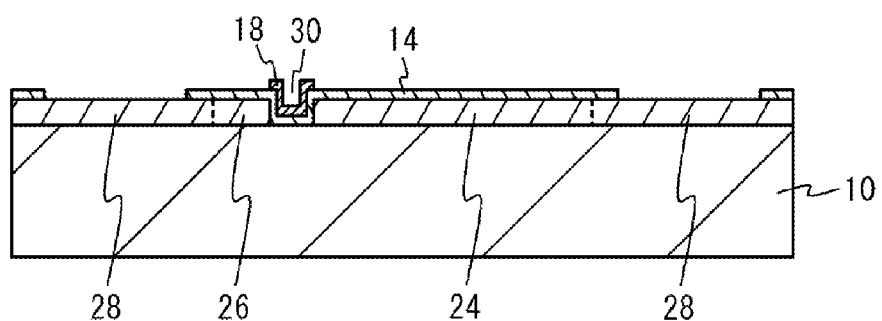
Figure 4D:
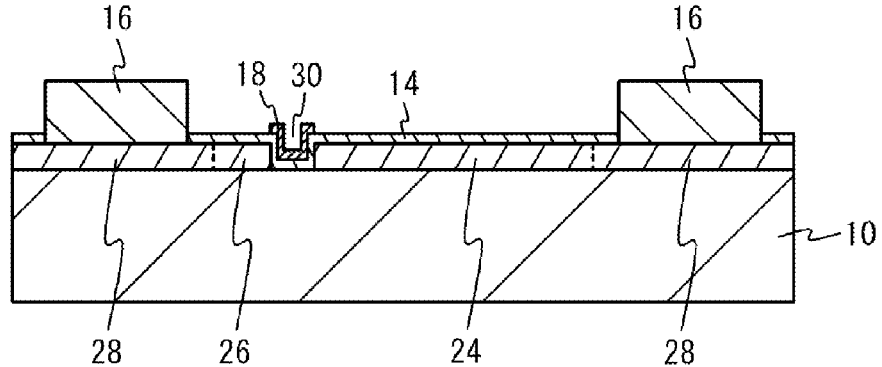

Referring to FIG. 4C, the protective film 14 is removed, by the exposure and etching techniques, in areas in which the metal films 16 are to be formed. Referring to FIG. 4D, the metal films 16 are formed on the bus bars 28 by vapor deposition and liftoff. The SAW device is fabricated by the process including the above steps of the second fabrication method.

Figure 5A:
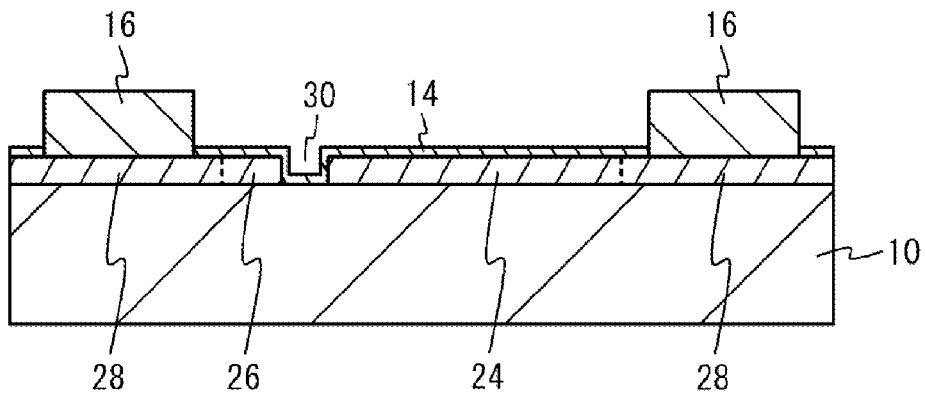
FIGS. 5A through 5C are cross-sectional views that illustrate a third embodiment for fabricating the SAW device of the first embodiment.
Figure 5B:
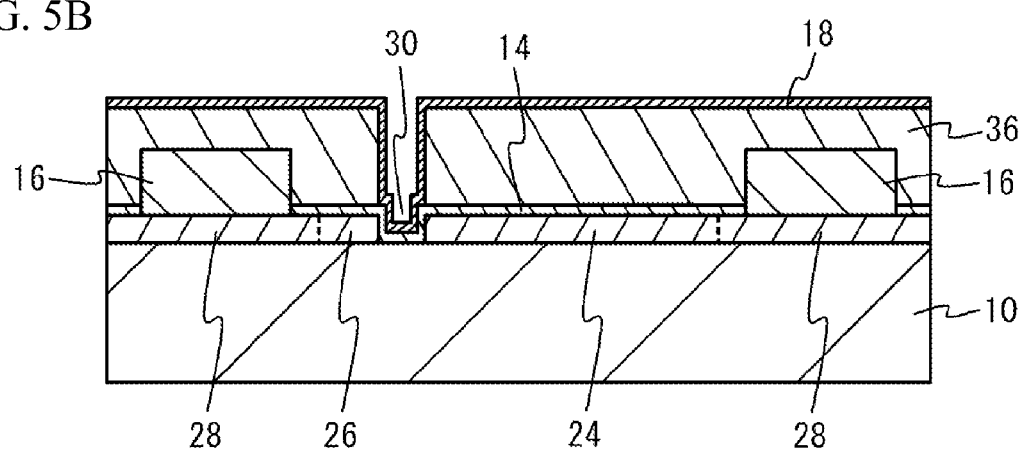
Figure 5C:
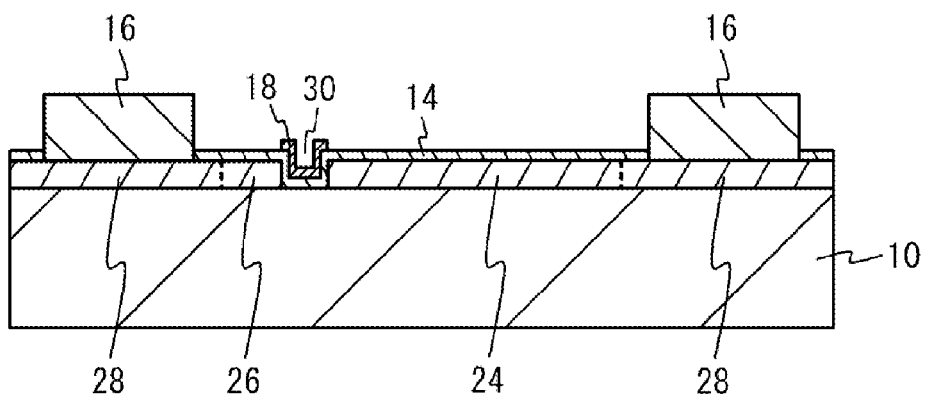

FIGS. 5A through 5C are cross-sectional views that illustrate a third method for fabricating the SAW device according to the first embodiment. A step illustrated in FIG. 5A follows the series of steps of FIGS. 2A through 2C through which the protective film 14 is removed in the areas in which the metal films 16 are to be formed. In FIG. 5A, the metal films 16 are formed on the bus bars 28 by vapor deposition and liftoff.

Referring to FIG. 5B, a resist film 36 having openings in areas in which the additional films 18 are to be formed is formed. Then, a film that is to be patterned into the additional films 18 is deposited on the whole surface by sputtering, for example. Referring FIG. 5C, the resist film 36 is removed by liftoff whereby the additional films 18 are formed. The SAW device of the first embodiment is fabricated by the process including the above steps of the third fabrication method.

A description is now given of an experiment conducted by the inventors. The inventors produced the SAW device of the first embodiment and measured the admittance characteristic, radiation conductance characteristic and Q characteristic of the produced SAW device. The specification of the SAW device produced is shown in Table 1.

TABLE 1

| | |
|---|---|
| Piezoelectric film | 42° Y-cut LiTaO$_3$ |
| IDT & reflectors | Al 180 nm |
| Protection film | SiO$_2$ 20 nm |
| Additional film | Al$_2$O$_3$ 70 nm |
| Wavelength of acoustic waves | 2 µm |
| Number of pairs of electrode fingers | 116 pairs |
| Number of electrode fingers of reflector | 40 |

TABLE 1-continued

| | |
|---|---|
| Duty ratio | 50% |
| Gap between tip ends | 0.175 λ |
| Length of dummy electrode fingers | 2.0 λ |
| Overlap length X | 0 λ |
| Overlap length Y | 0.1 λ |

As shown in FIG. 1, the piezoelectric substrate 10 was a 42° Y-cut lithium tantalate (LiTaO$_3$) substrate. The IDT 20 and the reflectors 12 were formed by aluminum (Al) film having a thickness of 180 nm. The protection film 14 was a silicon oxide (SiO$_2$) film having a thickness of 20 nm, and the additional films 18 were aluminum oxide (Al$_2$O$_3$) films having a thickness of 70 nm.

The wavelengths λ of the acoustic waves cited by the pair of comb-type electrodes 22 were 2 µm. The number of pairs of the electrode fingers 24 of the IDT 20 was 116, and the number of the electrode fingers of each reflector 12 was 40. The duty ratio of the electrode fingers 24 and the dummy electrode fingers 26 was 50%. The gaps between the tip ends of the electrode fingers 24 and those of the dummy electrode fingers 26 respectively located at the opposite sides of the gaps 30 in the first direction was 0.175λ where λ is the wavelengths of the acoustic waves (hereinafter the same applies to the below). The lengths of the dummy electrode fingers 26 were 2.0λ.

Figure 6:
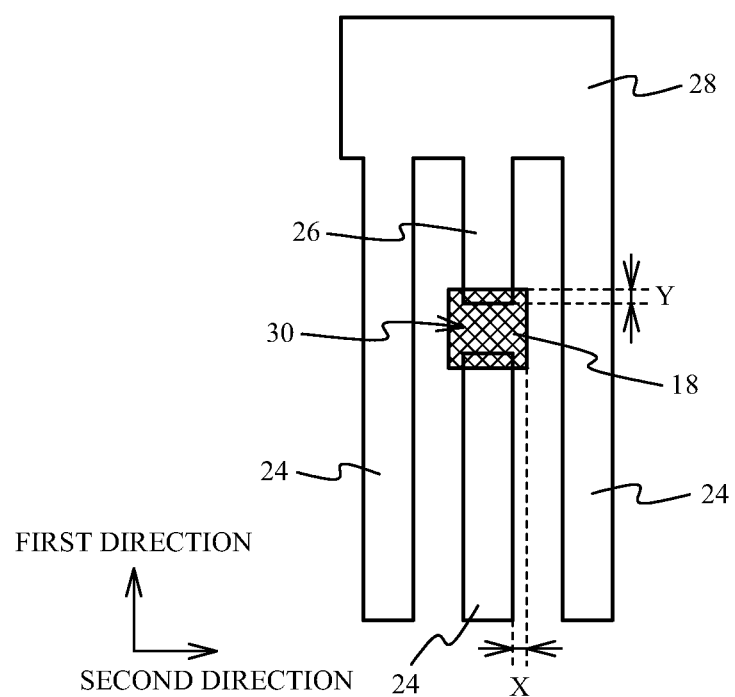
FIG. 6 is a top view of an overlap length.

The amount of covering with the additional films 18 with respect to the electrode fingers 24 and the dummy electrode fingers 26 located at the opposite sides of the gaps 30 in the first direction was 0.1λ. The amount of protrusion of the additional films 18 in the second direction from the side surfaces of the electrode fingers 24 and the dummy electrode fingers 26 located at the opposite sides of the gaps 30 in the first direction was 0λ. As illustrated in FIG. 6, an overlap length Y is defined as the amount of covering with the additional films 18 with respect to the electrode fingers 24 and the dummy electrode fingers 26 located at the opposite sides of the gaps 30 in the first direction. Further, an overlap length X is defined as the amount of protrusion of the additional films 18 in the second direction from the side surfaces of the electrode fingers 24 and the dummy electrode fingers 26 located at the opposite sides of the gaps 30 in the first direction.

Figure 7:
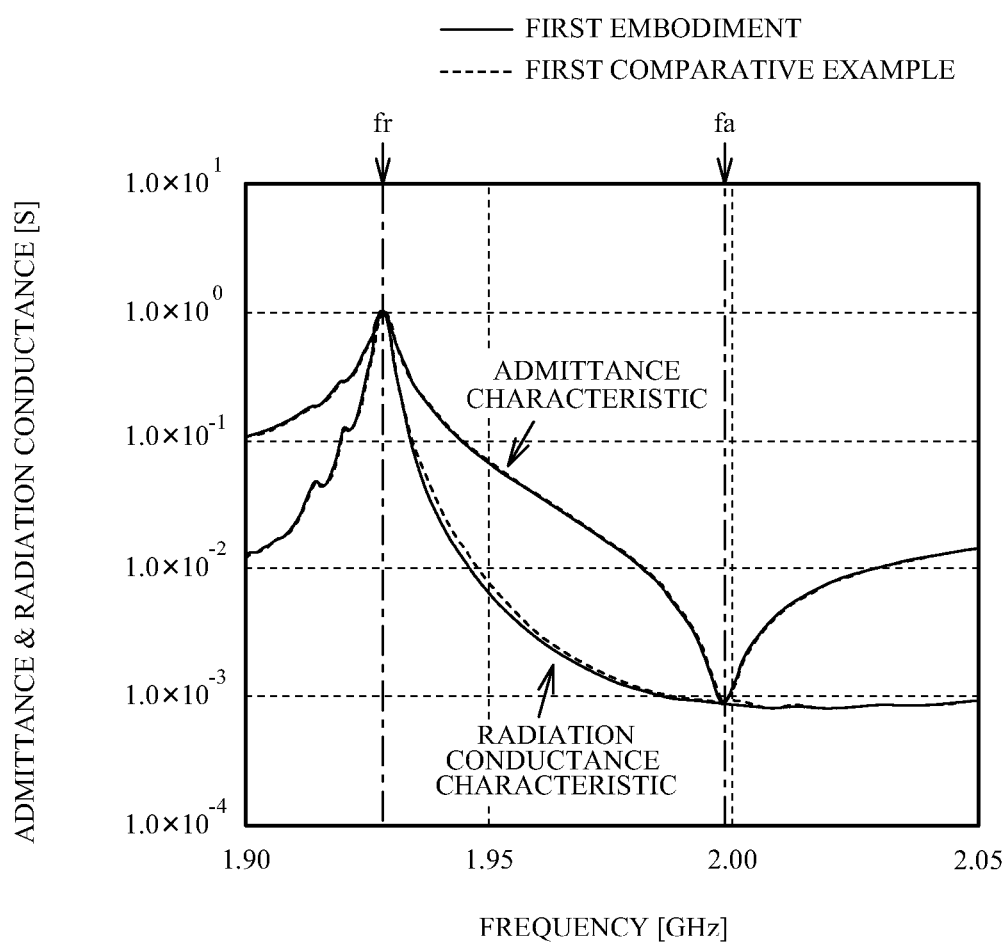
FIG. 7 is a diagram of measurement results of the admittance characteristic and radiation conductance characteristic of the SAW device of the first embodiment.

FIG. 7 is a diagram of measurement results of the admittance characteristic and the radiation conductance characteristic of the SAW device of the first embodiment. The measurement results of the first embodiment are illustrated by solid lines. For the purpose of comparison, the inventors measured the similar characteristics of a SAW device of a first comparative example that has the same structure as that of the first embodiment except that the first comparative example does not have the additional films 18. The measurement results of the first comparative example are illustrated by broken lines. As illustrated in FIG. 7, there was little difference in the admittance characteristic between the first embodiment and the first comparative example. In contrast, the radiation conductance characteristic of the first embodiment is smaller than that of the first comparative example in the range of a resonance frequency fr to an anti-resonance frequency fa.

Figure 8:
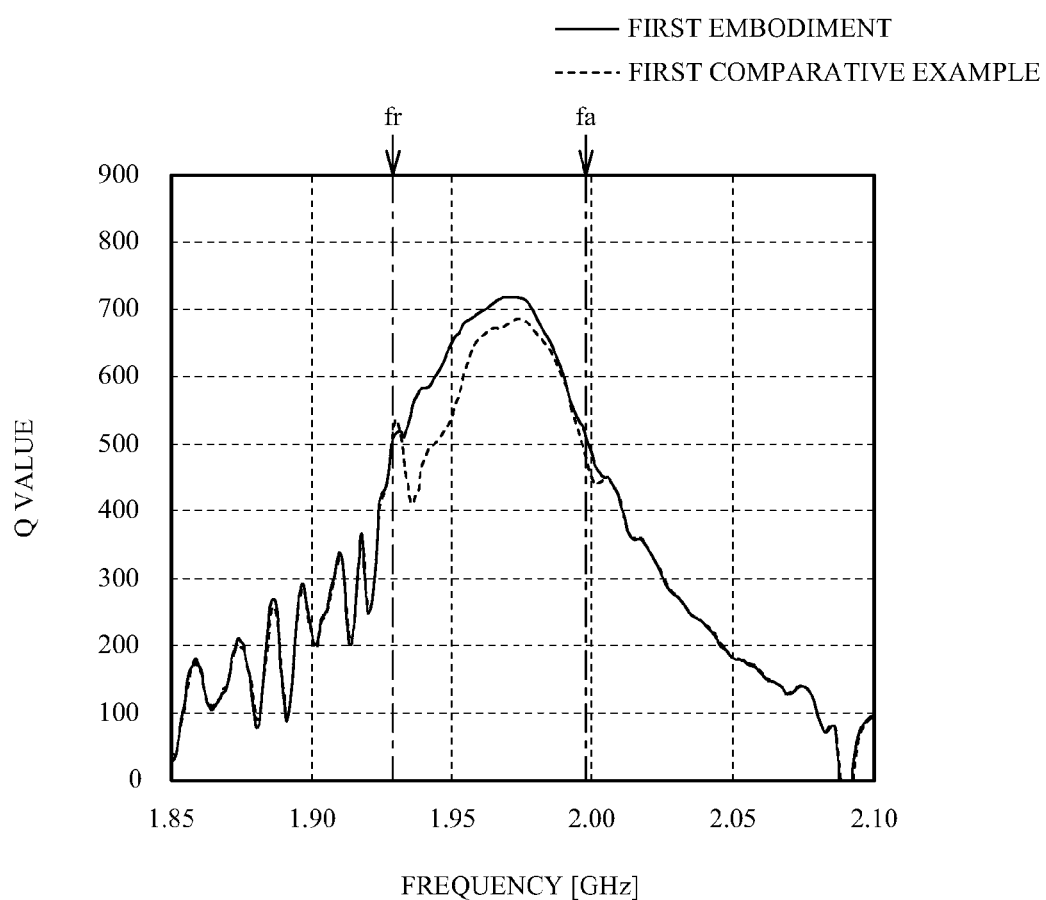
FIG. 8 is a diagram of a measurement result of the Q characteristic of the SAW device of the first embodiment.

FIG. 8 is a diagram of measurement results of the Q characteristic of the SAW device of the first embodiment and that of the SAW device of the first comparative example. As illustrated in FIG. 8, the first embodiment has improvement in the Q value between the resonance frequency fr and the anti-resonance frequency fa, as compared with the first comparative example. For example, the first comparative example has a considerable decrease of the Q value near the resonance frequency fr, while the first example does not have such a decrease.

It is seen from the results illustrated in FIGS. 7 and 8 that the additional films 18 lead to confinement of the acoustic waves, which results in a decrease of the radiation conductance and an improvement of the Q value.

Next, the inventors conducted an experiment for examining whether the effects of improvement in the Q characteristic due to the presence of the additional films 18 change for different duty ratios of the electrode fingers 24 and the dummy electrode fingers 26. First, the inventors produced first SAW devices of the first embodiment that have an overlap length X of 0λ and an overlap length Y of 0.1λ, and produced second SAW devices of the first embodiment that have an overlap length X of 0λ and an overlap length Y of 0.2λ. The inventors produced different first SAW devices that had respective different duty ratios of the electrode fingers 24 and the dummy electrode fingers 26 of 30%, 40%, 50% and 60%. Similarly, the inventors produced different second SAW devices that had respective different duty ratios of 30%, 40%, 50% and 60%. The other structures were the same as the corresponding structures in Table 1.

Figure 9A:
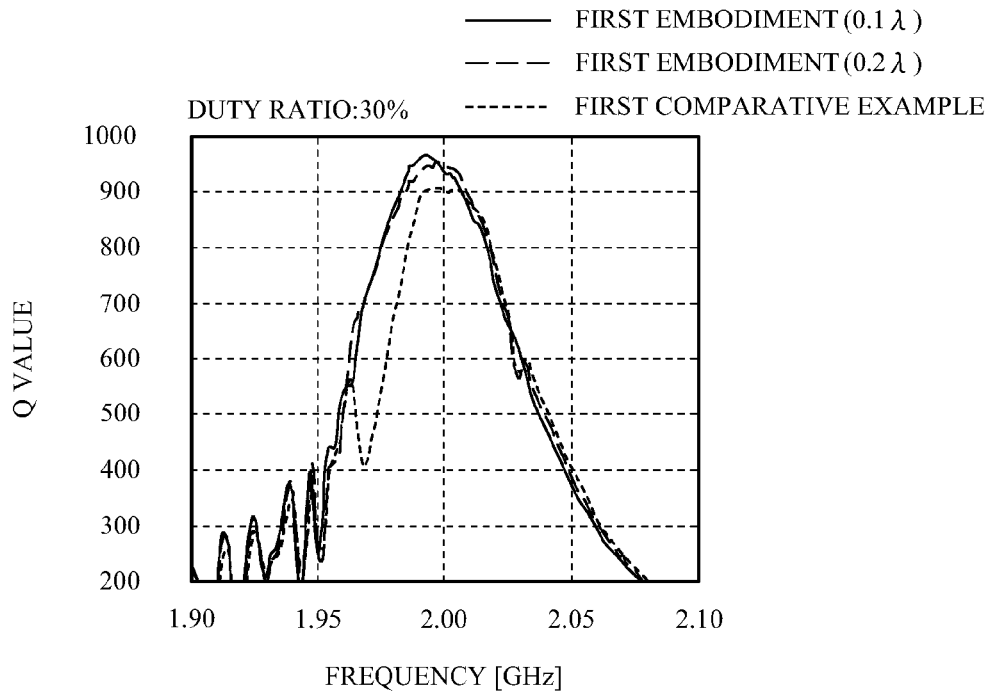
FIGS. 9A and 9B are diagrams of measurement results of the Q characteristics of the SAW devices of the first embodiment with different duty ratios.
Figure 9B:
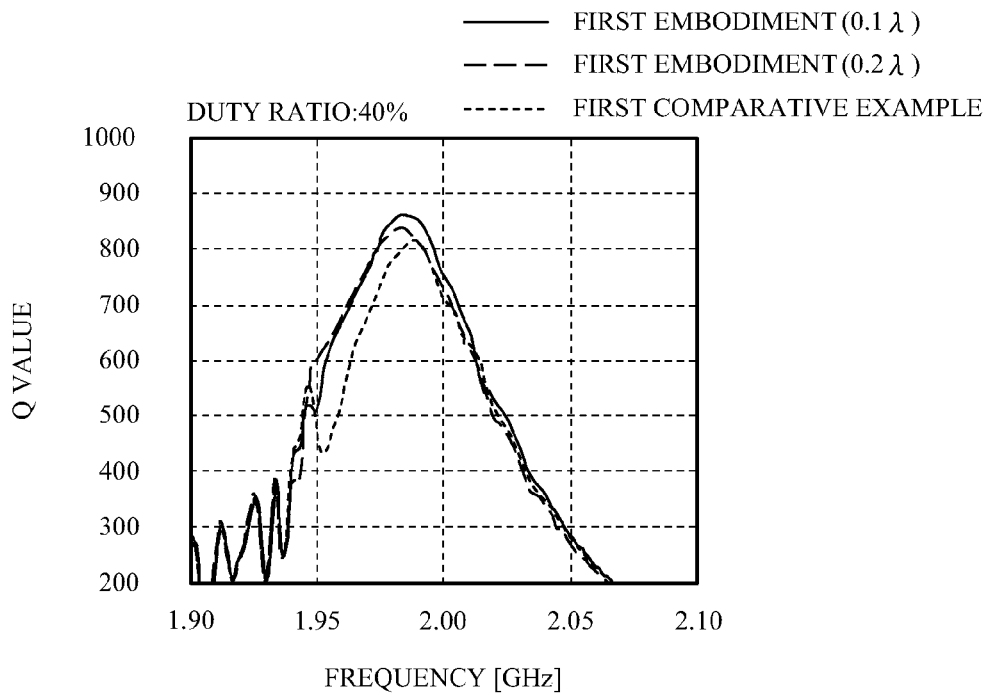
Figure 10A:
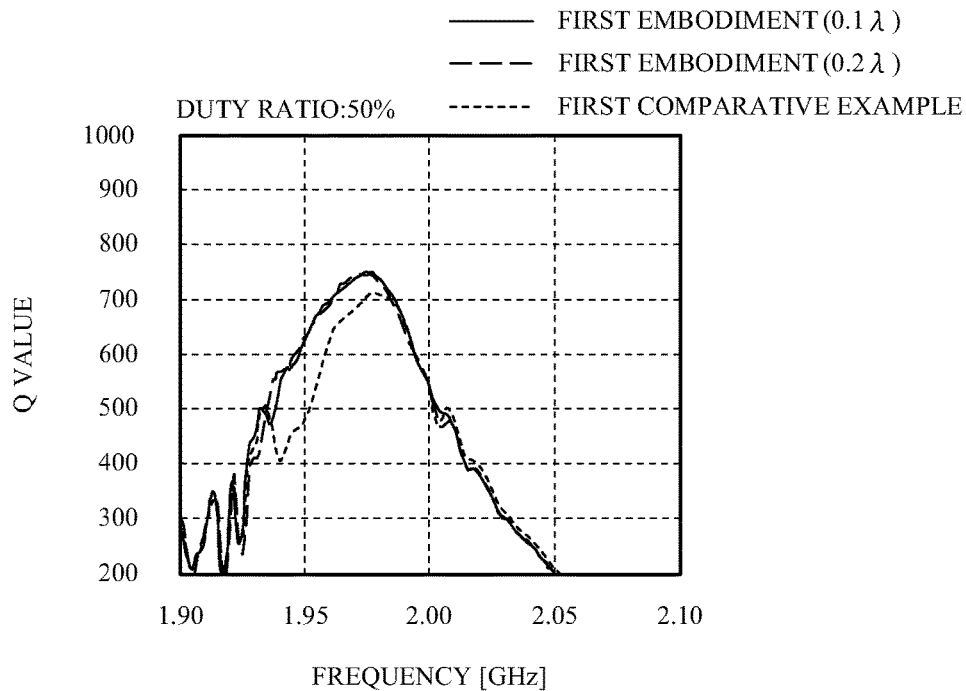
FIGS. 10A and 10B are diagrams of measurement results of the Q characteristics of the SAW devices of the first embodiment with different duty ratios.
Figure 10B:
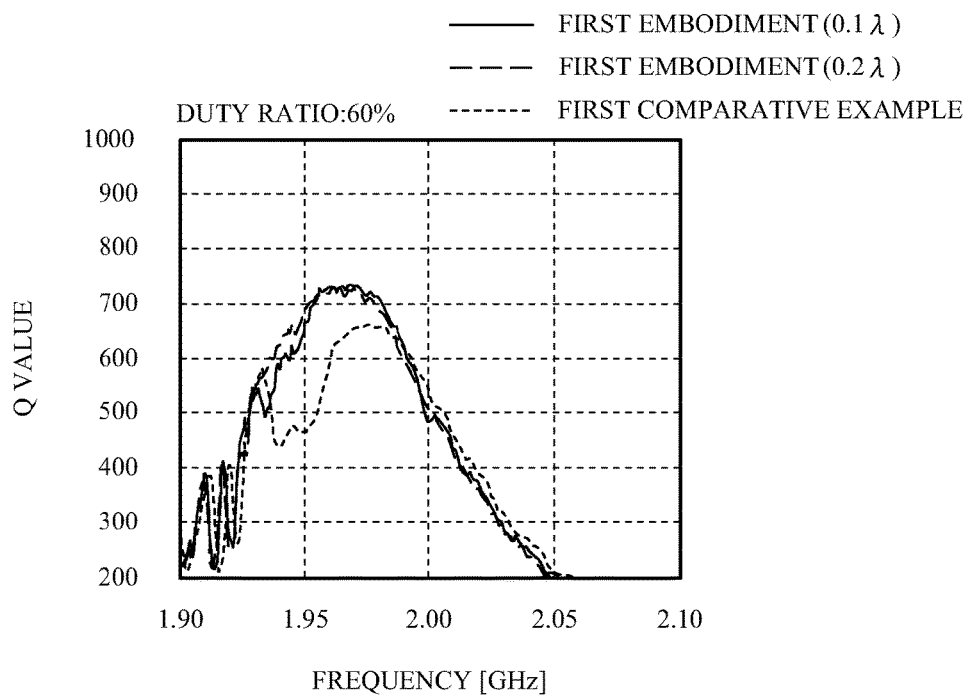

FIGS. 9A and 9B and FIGS. 10A and 10B are diagrams of measurement results of the Q characteristics of the SAW devices of the first embodiment having different duty ratios. More specifically, FIG. 9A illustrates measurement results for a duty ratio of 30%, and FIG. 9B illustrates measurement results for a duty ratio of 40%. FIG. 10A illustrates measurement results for a duty ratio of 50%, and FIG. 10B illustrates measurement results for a duty ratio of 60%. The measurement results for an overlap length Y of 0.1λ are indicated by solid lines, and the measurement results for an overlap length Y of 0.2λ are indicated by broken lines. For the purpose of comparison, the inventors measured SAW devices of the first comparative example that have the same structures as those of the first embodiment except that the first comparative example does not have the additional films 18. The measurement results of the first comparative example are indicated by dotted lines. It is seen from FIGS. 9A through 10B that improvements in the Q value due to the presence of the additional films 18 were observed for the different duty ratios.

Further, the inventors produced SAW devices of the first embodiment that have a common overlap length Y of 0.1λ but have different overlap lengths X of 0.1 μm for a duty ratio of 30%, 0.05 μm for a duty ratio of 40%, 0 μm for a duty ratio of 50%, and −0.05 μm for a duty ratio of 60%, and measured the Q values and the electromechanical coupling coefficients of these SAW devices. The other structures were the same as the corresponding structures in Table 1.

Figure 11:
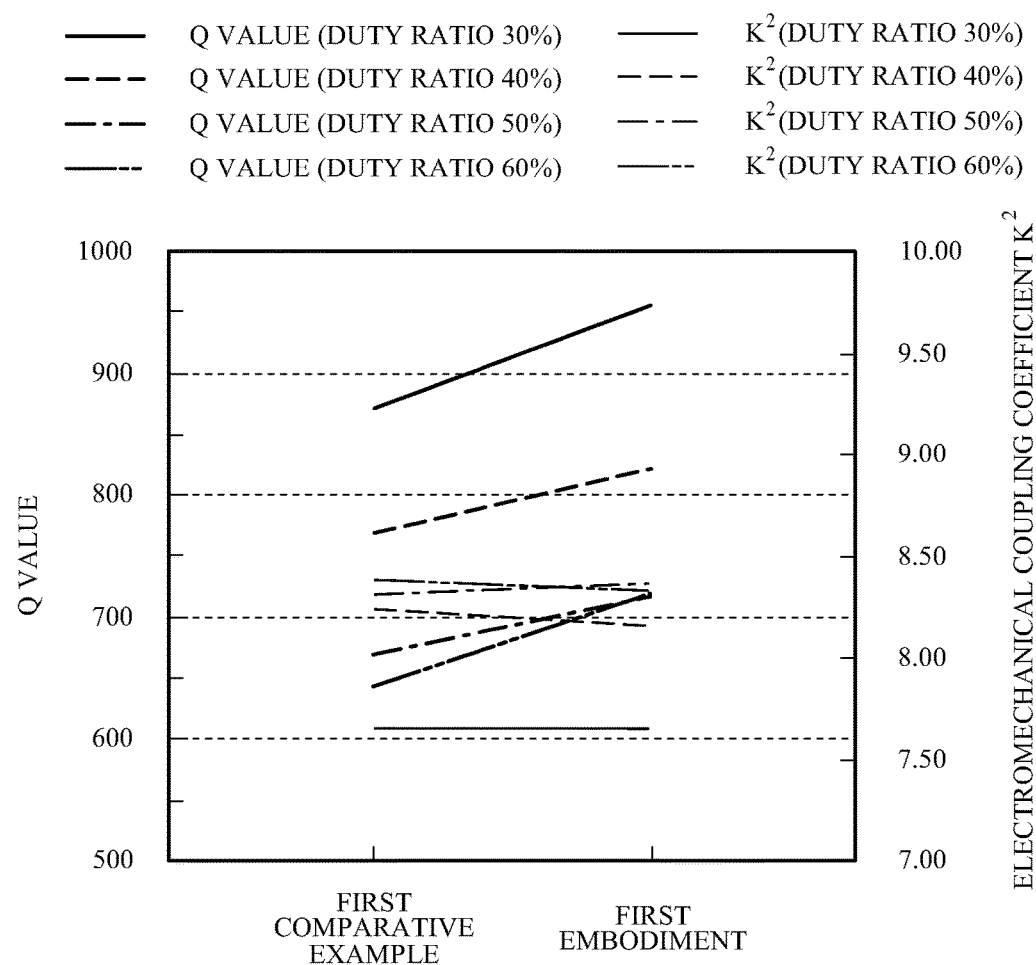
FIG. 11 is a diagram of measurement results of the Q values and electromechanical coupling coefficients of the SAW devices with different duty ratios.

FIG. 11 is a diagram of measurement results of the Q values and the electromechanical coupling coefficients of the SAW devices of the first embodiment having the different duty ratios. For the purpose of comparison, the measurement results of the SAW devices of the first comparative example illustrated in FIGS. 9A through 10B are illustrated. FIG. 11 illustrates the maximum values of the Q values and the electromechanical coupling coefficients $K^2$ for the respective duty ratios of 30%, 40%, 50% and 60%. The measurement results of the Q values are indicated by thick lines, and the measurement results of the electromechanical coupling coefficients $K^2$ are indicated by thin lines. The measurement results for the duty ratios of 30%, 40%, 50% and 60% are indicated by a solid line, a broken line, a one-dot chained line and a two-dot chained line, respectively. As illustrated in FIG. 11, even for the different duty ratios, the presence of the additional films 18 hardly changes the electromechanical coupling coefficient $K^2$ and improves the Q value.

Figure 12:
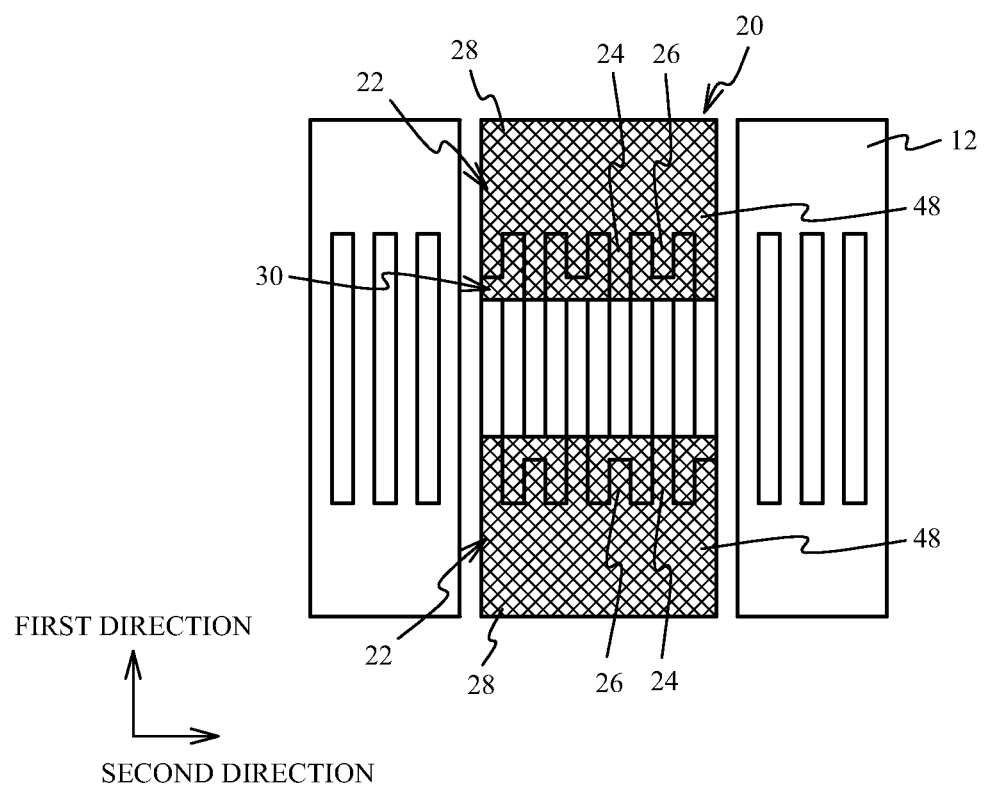
FIG. 12 is a tope view of a SAW device in accordance with a second comparative example.

Now, a description is given of a simulation of the Q characteristic of a SAW device in accordance with a second comparative example. FIG. 12 is a top view of a SAW device in accordance with the second comparative example. Referring to FIG. 12, the SAW device has additional films 48, each of which covers all of the corresponding gaps 30 and integrally extends from the gaps 30 so as to wholly cover the corresponding bus bar 28. A simulation was conducted in which the additional films 48 of the SAW device of the second comparative example were $Al_2O_3$ films having a thickness of 60 nm.

Figure 13:
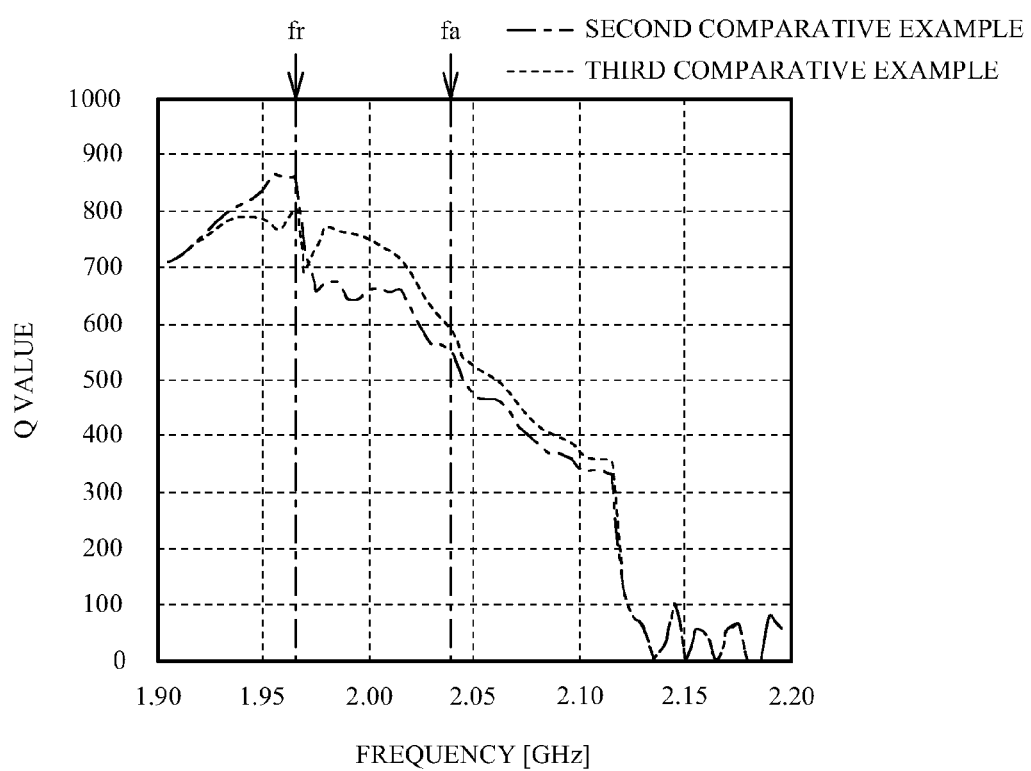
FIG. 13 is a diagram of a simulation result of the Q characteristic of the SAW device of the second comparative example.

FIG. 13 is a diagram of a simulation result of the Q characteristic of the SAW device of the second comparative example. One-dot chained line indicates the simulation result of the second comparative example. For the purpose of comparison, FIG. 13 indicates a dotted line that is a simulation device of a SAW device in accordance with a third comparative example that has the same structure as that of the second comparative example except that the third comparative example does not have the additional films. As illustrated in FIG. 13, the simulation results show that the second comparative example has Q values smaller than those of the third comparative example in the range of the resonance frequency fr to the anti-resonance frequency fa. It is seen from the above that the additional films 48 that cover the whole bus bars 28 do not improve the Q value.

It is seen from the simulation results of FIG. 13 that it is preferable to provide each of the gaps 30 with the respective additional films 18, as illustrated in FIGS. 1A and 1B. Preferably, the lithography technique is used to form the additional films in terms of ease of forming and thinning, as has been described with reference to FIGS. 2A through 3C. In this case, in terms of the size of the gaps 30 and the alignment accuracy in exposure, it is easy to form the additional films 18 so as to overlap with parts of the electrode fingers 24 and the dummy electrode fingers 26. When the simulation results illustrated in FIG. 13 are taken into consideration, it is conceivable that the larger the additional films 18, the weaker the improvement in the Q value. Thus, the inventors conducted a simulation for examining how the overlap lengths X and Y relate to the Q characteristic.

Figure 14:
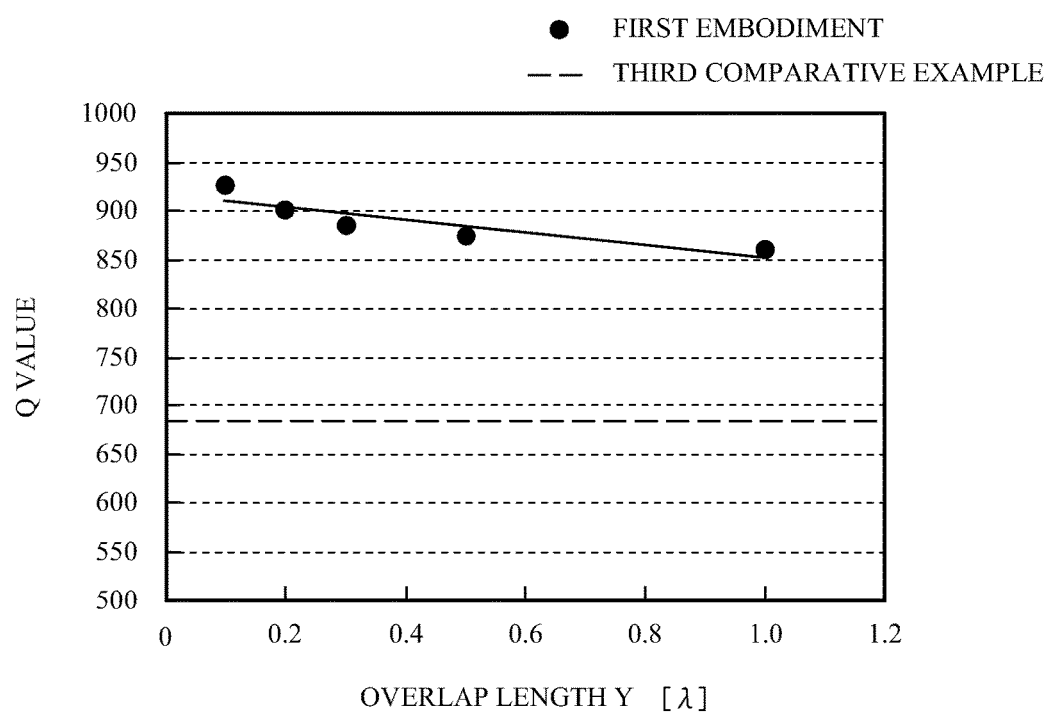
FIG. 14 is a diagram of simulation results of the Q characteristics of the SAW devices of the first embodiment with different overlap lengths Y.

In the simulation, the Q characteristics of the SAW devices of the first embodiment were measured. Specifically, the additional films 18 were $Al_2O_3$ films having a thickness of 60 nm, and the overlap length X of the additional films 18 was 0λ, while the overlap length Y thereof was set to 0.1λ, 0.2λ, 0.3λ, 0.5λ and 1.0λ. The other structures of the first embodiment in the simulation were the same as those of the second comparative example in FIG. 13. FIG. 14 illustrates a simulation result of the Q values of the SAW devices of the first embodiments having the different overlap lengths Y described above. This simulation result is depicted with filled circles, while a simulation result of the above-described third comparative example is indicated by a broken line. A solid line is a linear approximation of the simulation result of the first embodiment. In FIG. 14, the Q values are indicated near the resonance frequency fr.

It is seen from FIG. 14 that as the overlap length Y increases, the Q value near the resonance frequency fr tends to decrease. It is also seen that when the overlap length Y is equal to or smaller than 1.0λ, the Q values near the resonance frequency fr are improved. This shows that the overlap length Y is preferably equal to or smaller than 1.0λ.

Figure 15:
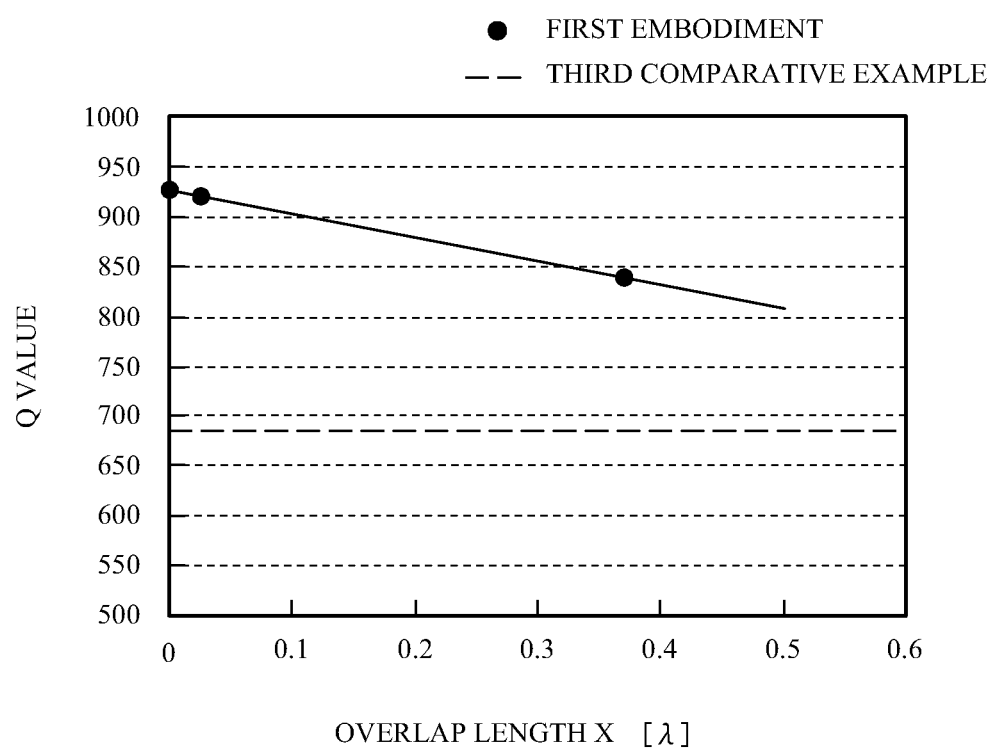
FIG. 15 is a diagram of simulation results of the Q characteristics of the SAW devices of the first embodiment with different overlap lengths X.
Figure 16A:
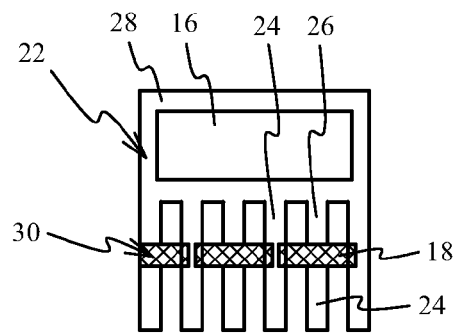
FIGS. 16A through 16F are respectively top views of SAW devices in accordance with first through sixth variations of the first embodiment.
Figure 16D:
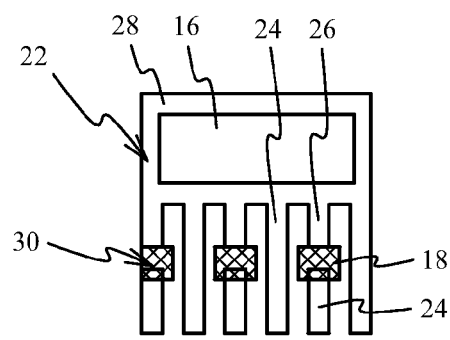
Figure 16B:
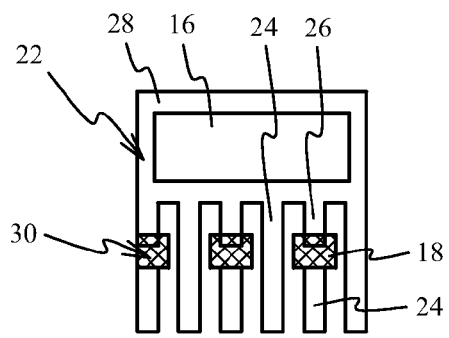
Figure 16E:
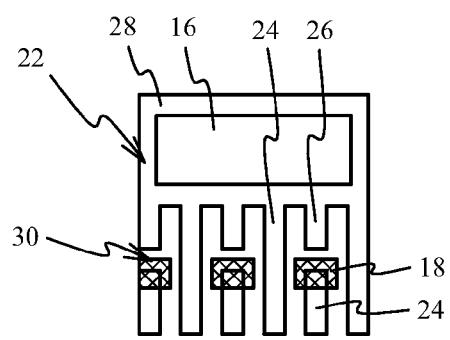
Figure 16C:
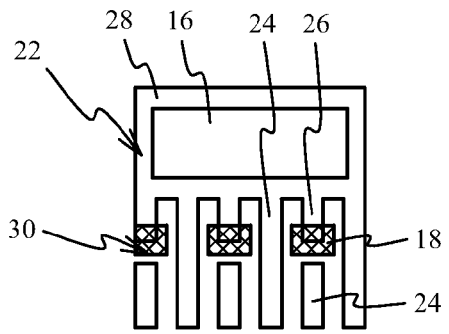
Figure 16F:
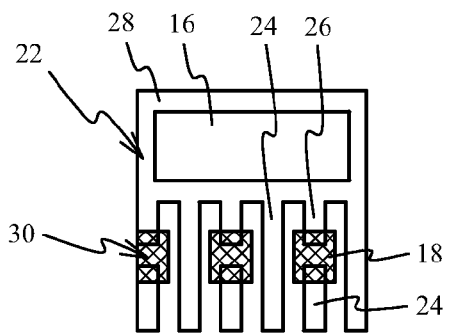

The inventors conducted another simulation of the Q characteristics of SAW devices of the first embodiment. Specifically, the additional films 18 were $Al_2O_3$ films having a thickness of 60 nm, and the overlap length Y of the additional films 18 was 0.1λ, while the overlap length X thereof was set to 0λ, 0.025λ and 0.037λ. The other structures of the first embodiment in the simulation were the same as those of the second comparative example in FIG. 13. FIG. 15 illustrates a simulation result of the Q values of the SAW devices of the first embodiments having the different overlap lengths X described above. This simulation result is depicted with filled circles, while a simulation result of the above-described third comparative example is indicated by a broken line. A solid line is a linear approximation of the simulation result of the first embodiment. In FIG. 15, the Q values are indicated near the resonance frequency fr.

It is seen from FIG. 15 that as the overlap length X increases, the Q value near the resonance frequency fr tends to decrease. It is also seen that when the overlap length X is equal to or smaller than 0.5λ, the Q values near the resonance frequency fr are improved. This shows that the overlap length X is preferably equal to or smaller than 0.5λ, for example. In the structure used in the simulation, when the overlap length X is 0.5λ, the additional films 18 adjacent to each other in the second direction are joined together to form a belt shape.

FIGS. 16A through 16F are top views of SAW devices in accordance with first through sixth variations of the first embodiment, respectively. In FIGS. 16A through 16F, for the sake of simplicity, only part of each of the SAW devices is illustrated. The first variation in FIG. 16A has the additional films 18 that overlap with the electrode fingers located at the sides of the gaps 30 in the second direction. The second variation in FIG. 16B has the additional films 18 that contact the boundaries between the gaps 30 and the electrode fingers 24 adjacent to the gaps 30 in the first direction and overlap with the dummy electrode fingers 26. The third variation in FIG. 16C has the additional films 18 that are spaced apart from the electrode fingers 24 adjacent to the gaps 30 in the first direction and overlap with the dummy electrode fingers 26. The fourth variation in FIG. 16D has the additional films 18 that contact the boundaries between the gaps 30 and the dummy electrode fingers 26 adjacent to the gaps 30 in the first direction and overlap with the electrode fingers 24. The fifth variation in FIG. 16E has the additional films 18 that are spaced apart from the dummy electrode fingers 26 adjacent to the gaps 30 in the first direction and overlap with the electrode fingers 24. The sixth variation in FIG. 16F has the additional films 18 that overlap with the electrode fingers 24 and the dummy electrode fingers 26 located at the opposite sides of the gaps 30 in the first direction and protrude from the side surfaces of the electrode fingers 24 and the dummy electrode fingers 26 in the second direction.

As described above, according to the first embodiment and the variations thereof, the additional films 18 are provided in the gaps 30 so as to cover at least parts of the gaps 30 and overlap with at least one of the first through third groups, wherein the first and second groups respectively include the electrode fingers 24 and the dummy electrode fingers 26 located at the opposite sides of the gaps 30 in the first direction, and the third group has the electrode fingers 24 located at the sides of the gaps 30 in the second direction. Thus, as illustrated in FIGS. 7 and 6, it is possible to suppress leakage of acoustic wave energy and to decrease the radiation conductance and the improve the Q value in the range of the resonance frequency fr to the anti-resonance frequency fa. A filter having the SAW device described above has a reduced insertion loss.

The arrangement of the additional films 18 that overlap with at least one of the first through third groups described above relaxes the accuracy of alignment of the additional films 18 and makes it easy to form the additional films. Furthermore, the additional films 18 provided in the gaps 30 make it possible to suppress the amount of covering of the electrode fingers 24 with the additional films 18 and to suppress deterioration of the electromechanical coupling coefficient and frequency deviation.

As described above, as the additional films 18 are larger, the improvement of the Q value is smaller. Therefore, as illustrated in FIG. 1A, it is preferable that the additional films 18 overlap with at least one of the first and second groups that respectively include the electrode fingers 24 and the dummy electrode fingers 26 located at the opposite sides of the gaps 30 in the first direction, and do not overlap with the electrode fingers 24 located at the sides of the gaps 30 in the second direction.

As described previously with reference to FIG. 14, in terms of improving the Q value, it is preferable that the overlap length Y is equal to or smaller than 1.0λ. That is, it is preferable that the additional films 18 overlap with at least one of the first and second groups that respectively include the electrode fingers 24 and the dummy electrode fingers 26 located at the opposite sides of the gaps in the first direction within the range of 1.0λ or less from the tip ends of the electrode fingers 24 and those of the dummy electrode fingers 26. Also, as the overlap length Y increases, the Q value tends to decrease, and thus, the overlap length Y is preferably equal to or smaller than 0.5λ and is more preferably equal to or smaller than 0.3λ.

As described with reference to FIG. 15, in terms of improving the Q value, it is preferable that the overlap length X is equal to or smaller than 0.5λ. That is, it is preferable that the amount of protrusion of the additional films 18 in the second direction from the electrode fingers 24 and the dummy electrode fingers 26 located at the opposite sides of the gaps 30 in the first direction. Since the Q value tends to decrease as the overlap length X increases, the overlap length X is preferably equal to or smaller than 0.2λ and is more preferably equal to or smaller than 0.1λ.

Second Embodiment

Figure 17:
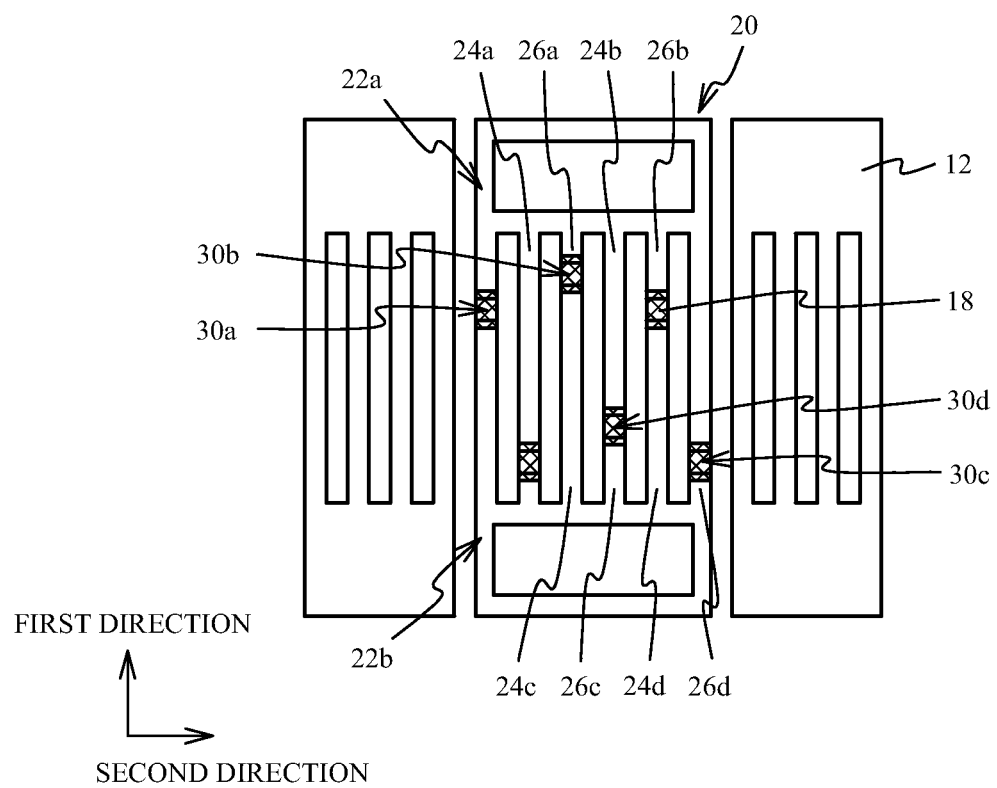
FIG. 17 is a top view of a SAW device in accordance with a second embodiment.

FIG. 17 is a top view of a SAW device in accordance with a second embodiment. The device in FIG. 17 is seen through a protection film as in the case of the first embodiment. As illustrated in FIG. 17, electrode fingers 24a and 24b of a comb-type electrode 22a that is paired with another comb-type electrode 22b are not equal to each other but have different lengths. Similarly, electrode fingers 24c and 24d of the comb-type electrode 22b are not equal to each other but have different lengths. The electrode fingers 24a and 24b of the comb-type electrode 22a having the different lengths are repeatedly provided, and the electrode fingers 24c and 24d of the comb-type electrode 22b are repeatedly provided. Accordingly, dummy electrode fingers 26a and 26b of the comb-type electrode 22a have different lengths, and dummy electrode fingers 26c and 26d of the comb-type electrode 22b have different lengths. With this arrangement, the positions of gaps 30a and those of gaps 30b are different from each other in the first direction, and the positions of gaps 30c and those of gaps 30d are different from each other in the first direction. The other structures of the second embodiment are the same as those of the first embodiment illustrated in FIG. 1A, and a description thereof is omitted here.

As in the case of the second embodiment, the positions of the gaps 30a and those of the gaps 30b may be different from each other in the first direction, and the positions of the gaps 30c and those of the gaps 30d may be different from each other. Even in this case, the additional films are provided in the gaps so as to cover at least parts of the gaps and to overlap with at least one of the first through third groups, wherein the first and second groups respectively include the electrode fingers 24 and the dummy electrode fingers 26 located at the opposite sides of the gaps in the first direction, and the third group has the electrode fingers 24 located at the sides of the gaps 30 in the second direction. It is thus possible to decrease the radiation conductance and improve the Q value. Thus, the SAW device of the second embodiment is similarly capable of improving the insertion loss.

Third Embodiment

Figure 18A:
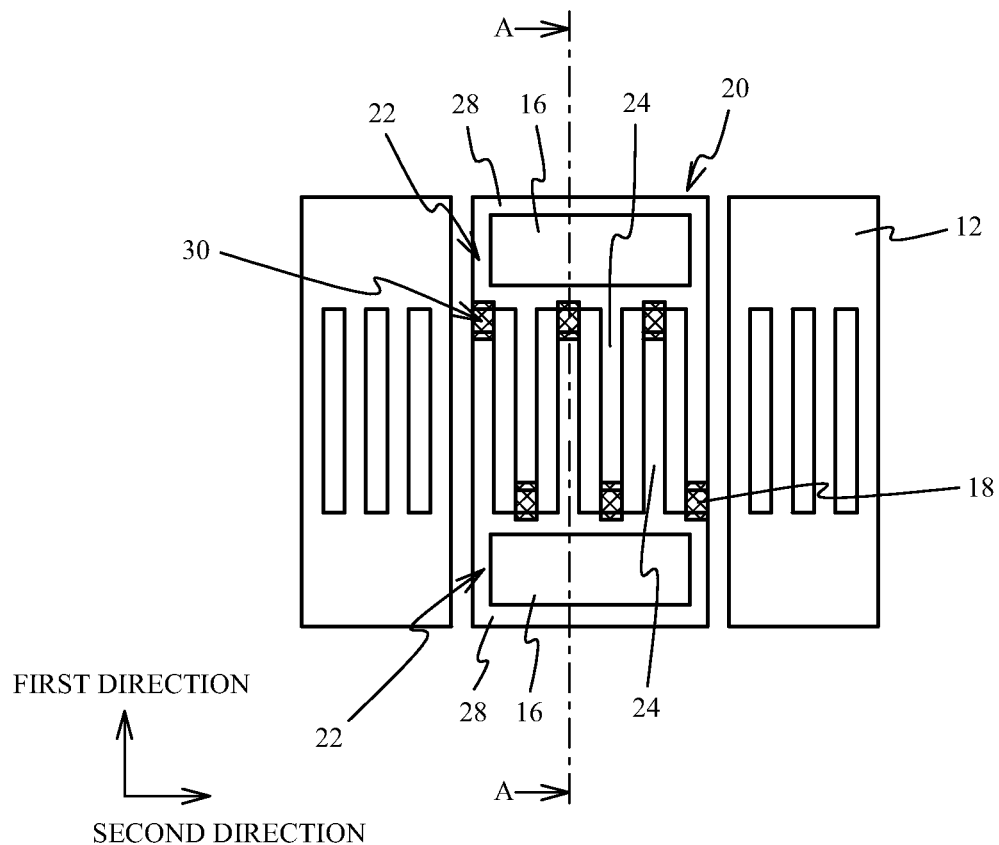
FIG. 18A is a top view of a SAW device in accordance with a third embodiment.
Figure 18B:
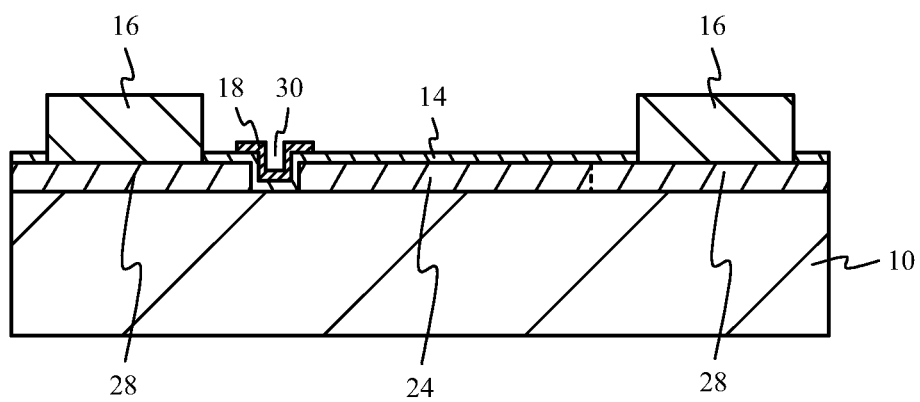
FIG. 18B is a cross-sectional view taken along a line A-A in FIG. 18A.

A third embodiment has an exemplary structure that does not have the dummy electrode finger 26. FIG. 18A is a top view of a SAW device in accordance with the third embodiment, and FIG. 18B is a cross-sectional view taken along a line A-A in FIG. 18A. The device in FIG. 18A is seen through a protection film. Referring to FIGS. 18A and 18B, the dummy electrode fingers 26 are not provided between the electrode fingers 24, and the pair of comb-type electrodes 22 are arranged so that the electrode fingers 24 of one of the pair of comb-type electrodes 22 face the bus bar 28 of the other comb-type electrode 22. With this arrangement, the gaps 30 are defined between the tip ends of the electrode fingers 24 and the side of the bus bar 28. The additional films 18 are provided in the gaps 30 so as to cover the gaps 30 and to overlap with parts the electrode fingers 24 and the bus bar 28 located at opposite sides of the gaps 30 in the first direction. The other structures are the same as those of the first embodiment illustrated in FIGS. 1A and 1B, and a description thereof is omitted.

As in the case of the third embodiment, even when the dummy electrode fingers 26 are not provided, the additional films 18 are provided in the gaps 30 so as to cover at least parts of the gaps and to overlap with at least one of the first through third groups wherein the first and second groups respectively include the electrode fingers 24 and the bus bar 28 located at the opposite sides of the gaps 30 in the first direction, and the third group includes the electrode fingers 24 located at the sides of the gaps in the second direction. It is thus possible to reduce the radiation conductance and improve the Q value. Thus, a filter with the SAW device of the third embodiment has an improved insertion loss. Additionally, it is possible to form the additional films 18 with ease and to suppress deterioration of the electromechanical coupling coefficient and frequency deviation. The additional films 18 of the third embodiment may be formed in the gaps 30 by a method similar to that of the first embodiment illustrated in FIGS. 16A through 16F.

Even in the third embodiment, as in the case of the first embodiment, it is preferable that the additional films 18 overlap with at least one of the first and second groups that respectively include the electrode fingers 24 and the dummy electrode fingers 26 located at the opposite sides of the gaps 30 in the first direction, and do not overlap with the electrode fingers 24 located at the sides of the gaps 30 in the second direction. It is preferable that the additional films 18 overlap with at least one of the first and second groups that respectively include the electrode fingers 24 and the bus bar 28 within a range of $1.0\lambda$ or less from the tip ends of the electrode fingers 24 and the side of the bus bar 28. The above range is more preferably equal to or smaller than $0.5\lambda$, and is much more preferably equal to or smaller than $0.3\lambda$. It is preferable that the amount of protrusion of the additional films 18 in the second direction from the side surfaces of the electrode fingers 24 adjacent to the gaps 30 in the first direction is equal to or smaller than $0.5\lambda$. The above amount of protrusion is more preferably equal to or smaller than $0.2\lambda$, and is much more preferably equal to or smaller than $0.1\lambda$.

In the first through third embodiments, the additional films 18 are preferably provided in all of the gaps 30 in terms of suppression of leakage of the acoustic wave energy. However, it is possible to employ a variation of this arrangement in which some of the gaps 30 are not provided with the additional films 18.

Fourth Embodiment

Figure 19:
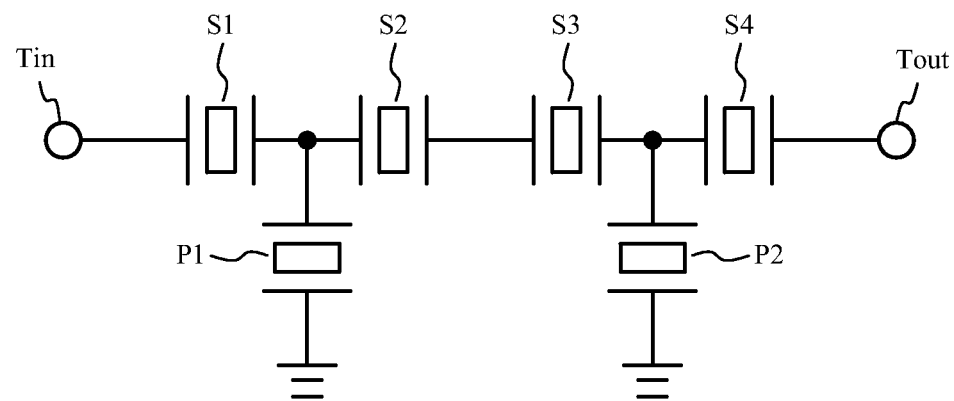
FIG. 19 is a circuit diagram of a ladder filter in accordance with a fourth embodiment.

A fourth embodiment is an exemplary filter to which the SAW device of the first embodiment is applied. FIG. 19 is a circuit diagram of a ladder filter in accordance with the fourth embodiment. Referring to FIG. 19, the ladder filter of the fourth embodiment has a plurality of series resonators S1 to S4 connected in series between an input terminal Tin and an output terminal Tout, and a plurality of parallel resonators P1 and P2 connected in parallel. At least one of the series resonators S1 to S4 and the parallel resonators P1 and P2 may be the SAW device of the first embodiment. However, the fourth embodiment described below has an arrangement in which all of the series resonators S1 to S4 and the parallel resonators P1 and P2 are the SAW devices of the first embodiment.

A description is now given of an experiment conducted by the inventors. The inventors produced a ladder filter of the fourth embodiment having the following specification. That is, the SAW device having the structure described in Table 1 is applied to each of the series resonators S1~S4, and a SAW device that has the same structure as described in Table 1 except that the number of pairs of electrode fingers 24 of the IDT 20 is 80 is applied to each of the parallel resonators P1 and P2. The inventors measured the band pass characteristic and the reflection characteristic of the ladder filter produced. For the purpose of comparison, the inventors produced a ladder filter according to a fourth comparative example that is the same as the above ladder filter of the fourth embodiment except that the fourth comparative example does not have the additional films 18.

Figure 20A:
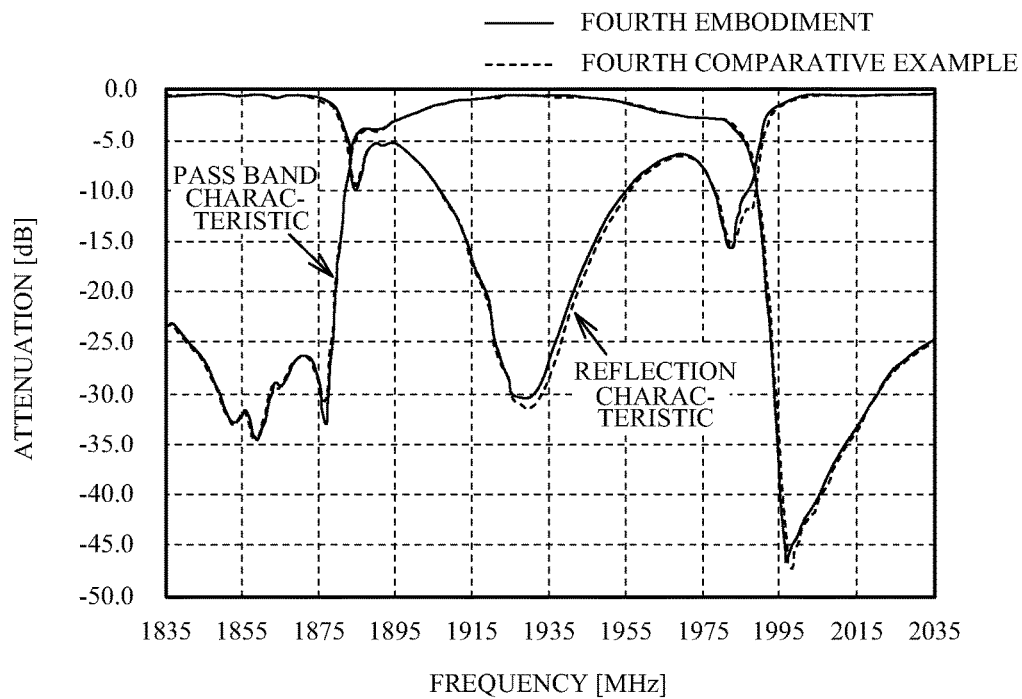
FIG. 20A is a diagram of measurement results of the band pass characteristic and the reflection characteristic of the ladder filter of the fourth embodiment.
Figure 20B:
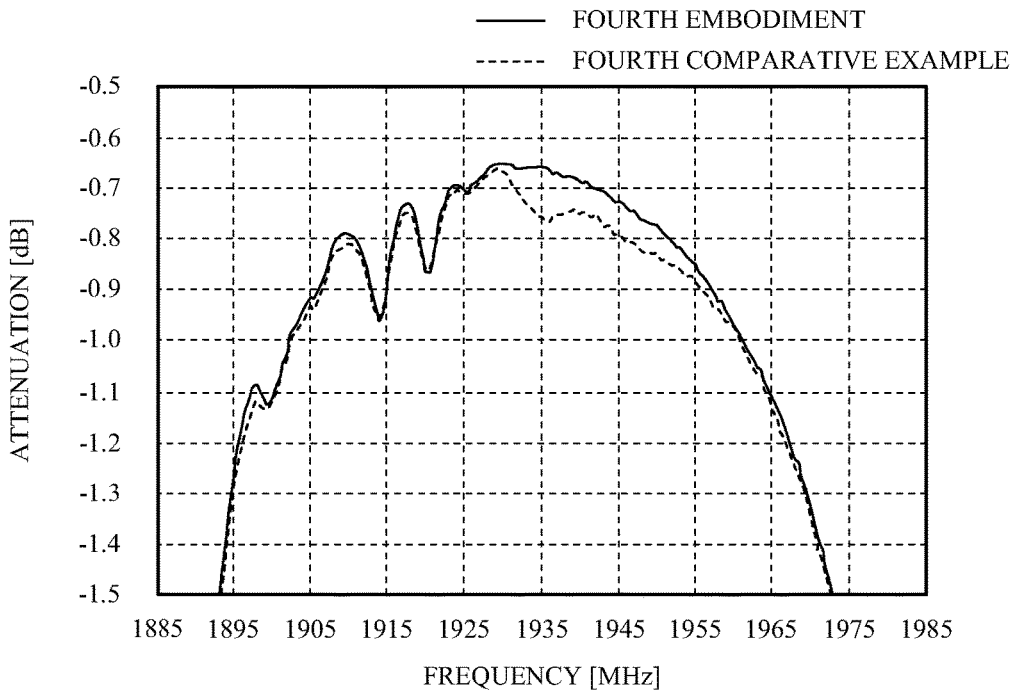
FIG. 20B is an enlarged view of the band pass characteristic in the passband of FIG. 20A.

FIG. 20A is a diagram of measurement results of the band pass characteristic and the reflection characteristic of the ladder filter of the fourth embodiment, and FIG. 20B is an enlarged view of the band pass characteristic in the passband of FIG. 20A. The measurement result of the fourth embodiment is indicated by a solid line, and that of the fourth comparative example is indicated by a dotted line. In FIG. 20B, there is illustrated a band pass characteristic with the return loss being set to zero (no influence of the return loss) since the return loss affects the insertion loss. As illustrated in FIG. 20A, the fourth embodiment and the fourth comparative example have almost the same characteristics. This shows that the characteristics of the SAW devices with the additional films 18 have only a small change. Also, as illustrated in FIG. 20B, as compared to the fourth comparative example, the fourth embodiment has improved insertion loss in the passband. This shows that the SAW devices with the additional films 18 are capable of improving the insertion loss.

As described above, the filter with the SAW devices with the additional films 18 according to the first embodiment has improvement in insertion loss. Even when the additional films 18 are provided, the electromechanical coupling coefficient of the resonator are not reduced greatly, and the passband and the suppression characteristic outside of the passband are similarly maintained. It follows that the insertion loss can be improved by simply adding, without any design change, the additional films 18 to the structure that has been designed without the additional films 18. In the fourth embodiment described above, all of the series resonators S1 to S4 and the parallel resonators P1 and P2 are formed with the SAW devices of the first embodiment. However, the fourth embodiment may be varied so that at least one of the series resonators S1 to S4 and the parallel resonators P1 and P2 is formed with the SAW device configured according to any of the first embodiment, any of the variations of the first embodiment, the second embodiment and the third embodiment. Also, the fourth embodiment is not limited to ladder filter but may be other types of filters having the gaps 30 such as a multimode filter having a structure with the gaps 30.

Fifth Embodiment

Figure 21A:
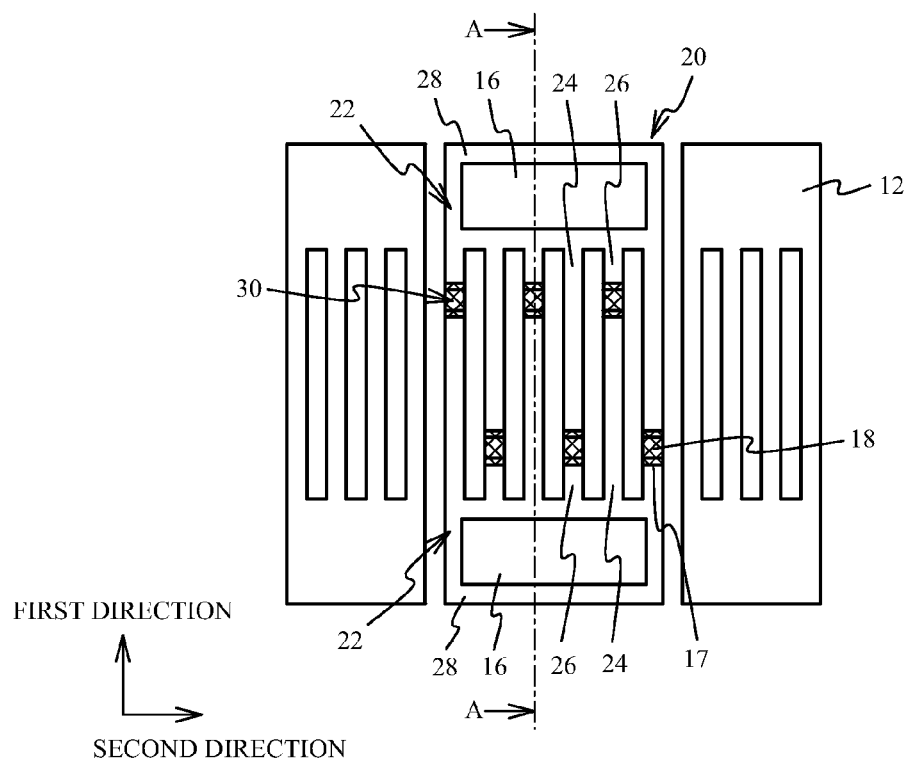
FIG. 21A is a top view of a SAW device in accordance with a fifth embodiment.
Figure 21B:
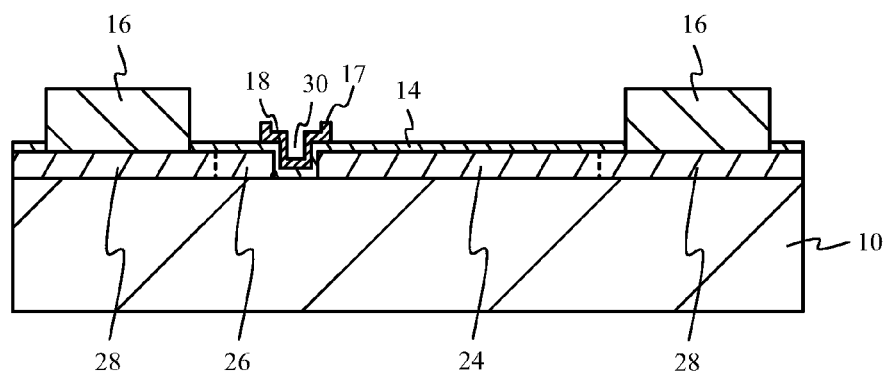
FIG. 21B is a cross-sectional view taken along a line A-A in FIG. 21A.

A fifth embodiment has a structure in which protrusions 17 are provided on the end portions of the additional films 18 in the first direction. FIG. 21A is a top view of a SAW device in accordance with the fifth embodiment, and FIG. 21B is a cross-sectional view taken along a line A-A in FIG. 21A. The SAW device in FIG. 21A is seen through a protection film. Referring to FIGS. 21A and 21B, the gaps 30 are formed between the tip ends of the electrode fingers 24 and those of the dummy electrode fingers 26. The additional films 18 are provided so as to cover the gaps 30 and overlap with parts of the electrode fingers 24 and the dummy electrode fingers 26 located at the opposite sides of the gaps 30 in the first direction. The additional films 18 have the protrusions 17 on the end portions thereof in the first direction. The remaining structures are the same as those of the first embodiment illustrated in FIGS. 1A and 1B, and a description thereof is omitted here.

Figure 22A:
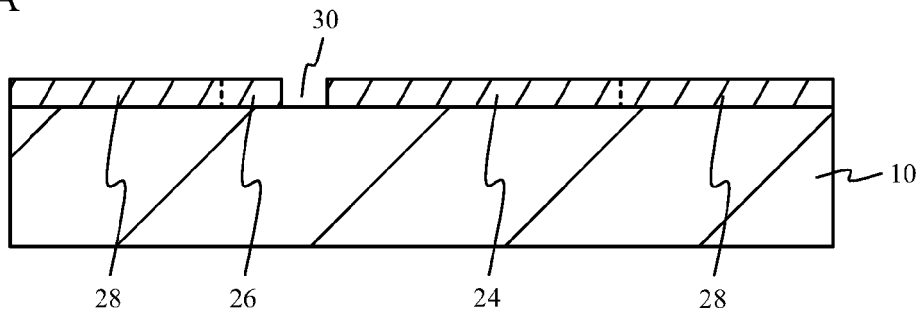
FIGS. 22A through 22D are cross-sectional views that illustrate a method for fabricating the SAW device of the fifth embodiment.

A description is now given of a method for fabricating the SAW device in accordance with the fifth embodiment. FIGS. 22A through 22D and FIGS. 23A through 23C are cross-sectional views that illustrate a method for fabricating the SAW device in accordance with the fifth embodiment. As illustrated in FIG. 22A, a metal film is deposited on the piezoelectric substrate 10 and is shaped into the IDT 20 and the reflectors 12 by the exposure technique and the etching technique, for example. As described previously, the IDT 20 is made up of a pair of comb-type electrodes 22, each including the electrode fingers 24, the dummy electrode fingers 26 and the bus bar 28. The gaps 30 are formed between the tip ends of the electrode fingers 24 and those of the dummy electrode fingers 26.

Figure 22B:
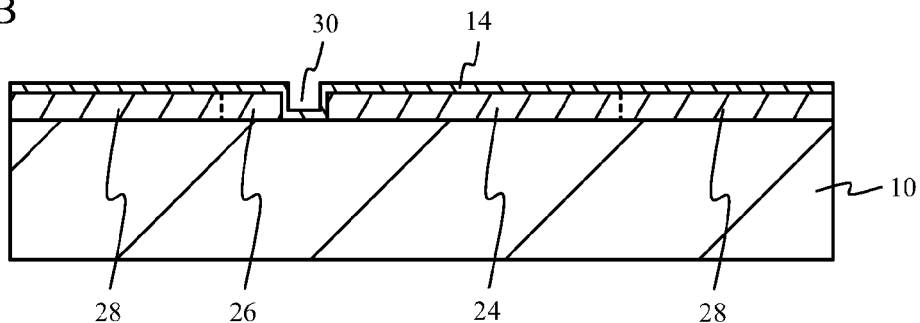
Figure 22C:
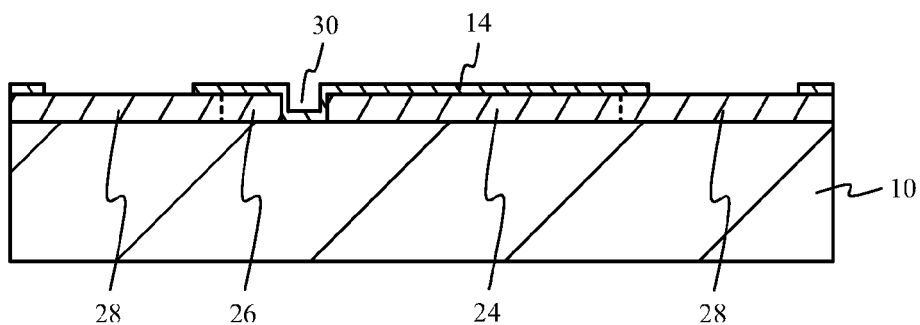
Figure 22D:
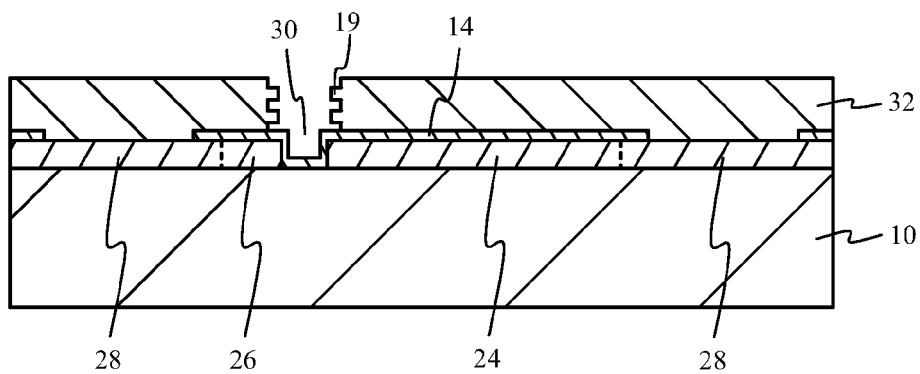

As illustrated in FIG. 22B, the protection film 14 is deposited on the entire surface by sputtering, for example. As illustrated in FIG. 22C, by using the exposure technique and the etching technique, for example, the protection film 14 is removed from areas in which the metal film 16 is to be formed. As illustrated in FIG. 22D, the resist film 32 is formed on the entire surface, and is then removed from areas in which the additional films 18 are to be formed by utilizing a standing wave due to the reflection of exposure light in a stepper in such a manner that steps 19 remain on the side surfaces, whereby openings are formed.

Figure 23A:
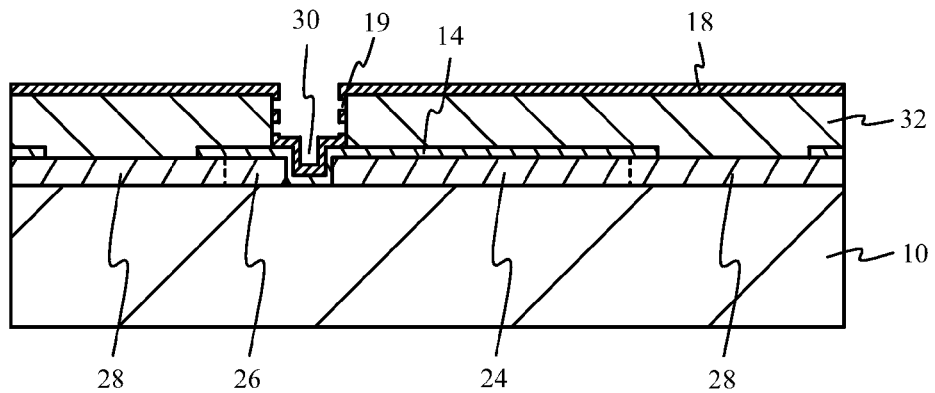
FIGS. 23A through 23C are cross-sectional views that illustrate steps that follow those of the method illustrated in FIGS. 22A through 22D.
Figure 23B:
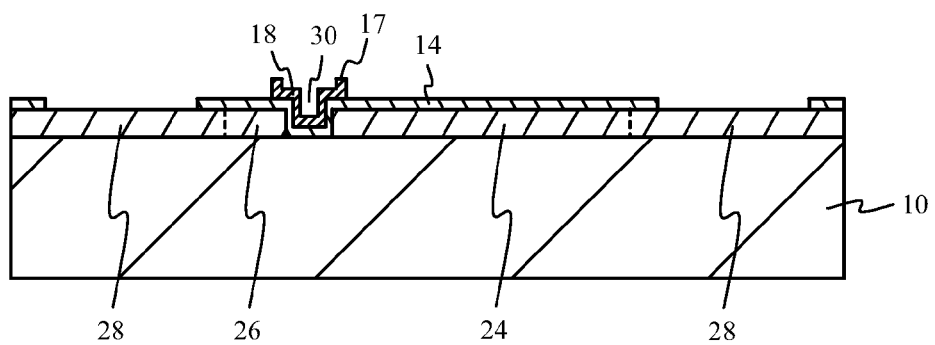
Figure 23C:
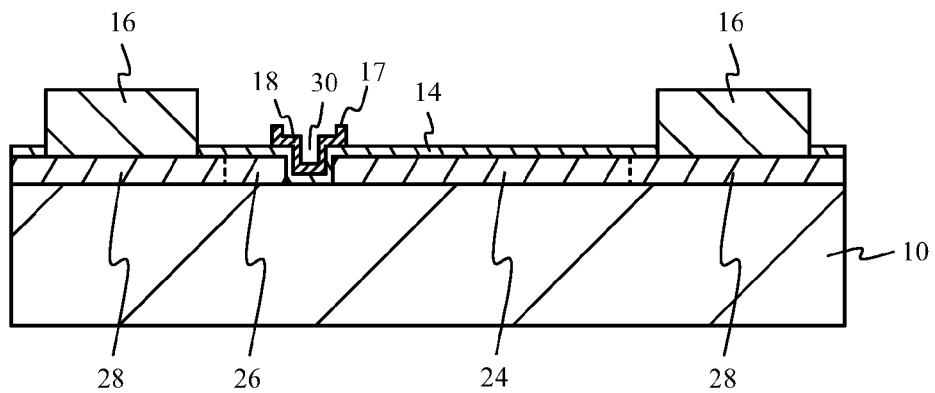

As illustrated in FIG. 23A, the additional film 18 is deposited on the entire surface by sputtering, for example. In this step, due to the presence of the steps 19 on the side surfaces of the resist film 32 in the openings, the additional films 18 are formed to have steps. As illustrated in FIG. 23B, the resist film 32 is removed by liftoff, so that the additional films 18 deposited on the entire surface are patterned into a shape having the protrusions 17 on the end portions in the first direction. The height of the steps 19 formed on the side surfaces of the resist film 32 in the openings depends on the wavelength of exposure light, the refractive index and the thickness of resist, and the like, which are easily obtained by a process simulator or the like. It is thus possible to control the height of the steps 19 with a range of $0.05\lambda$ or less. As illustrated in FIG. 23C, the metal film 16 is formed on the bus bars 28 by the evaporation method and liftoff, for example. The SAW device of the fifth embodiment is manufactured by the process including the above-described steps. The fabrication method of the fifth embodiment may be based on not only the fabrication method of the first embodiment but also the fabrication methods of the second and third embodiments.

Now, a description is given of a simulation conducted by the inventors. The inventors conducted a simulation by using the finite element method (FEM) in order to examine the Q characteristics of the SAW devices of the first embodiment, the first comparative example and the fifth embodiment. The SAW device of the fifth embodiment used in the simulation had the following specification. The additional films 18 were aluminum nitride ($Al_2O_3$) films having a thickness of 60 nm. The other structures were the same as illustrated in Table 1. The height of the protrusions 17 on the end portions of the additional films 18 in the first direction was $0.025\lambda$.

Figure 24:
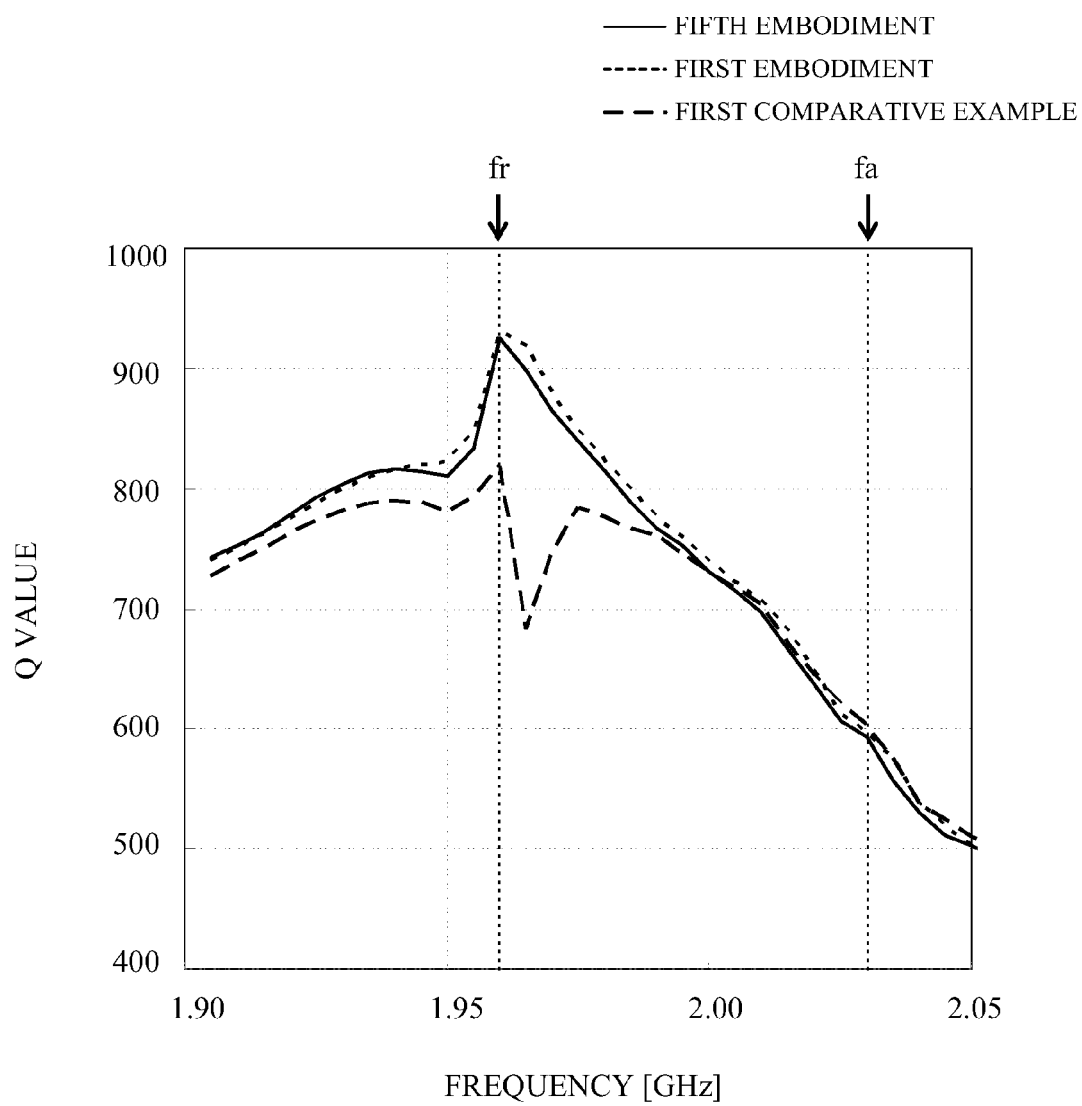
FIG. 24 is a diagram of a simulation result of the Q characteristic of the SAW device of the fifth embodiment.

FIG. 24 is a diagram of simulation results of the Q characteristics of the SAW devices of the fifth embodiment, the first embodiment and the first comparative example. As illustrated in FIG. 24, the fifth embodiment with the protrusions 17 has improvement in the Q value between the resonance frequency fr and the anti-resonance frequency fa as much as the first embodiment, as compared to the first comparative example.

It is seen from the simulation results in FIG. 24 that the additional films 18 having the protrusions 17 on the end portions in the first direction leads to confinement of the acoustic waves, which results in improvement of the Q value between the resonance frequency fr and the anti-resonance frequency fa.

It is also seen from FIG. 24 that the fifth embodiment has considerable improvement in the Q value at frequencies lower than the resonance frequency fr due to the presence of the protrusions 17. When the SAW devices of the fifth embodiment are applied to series resonators of a ladder filter such as series resonators S1 to S4 of the ladder filter illustrated in FIG. 19, the insertion loss in the passband can be improved more greatly. When the SAW devices of the fifth embodiment are applied to parallel resonators of a ladder filter such as parallel resonators P1 and P2 of the ladder filter illustrated in FIG. 19, the suppression outside of the passband can be much more improved.

The present invention is not limited to the specifically described embodiments and variations but other embodiments and variations may be made without departing from the scope of the claimed invention.

What is claimed is:

1. A surface acoustic wave device comprising:
   a pair of comb-type electrodes that are provided on a piezoelectric substrate and include electrode fingers and dummy electrode fingers, the electrode fingers of one of the pair of comb-type electrodes facing the dummy electrode fingers of the other comb-type electrode; and
   additional films that are provided to cover gaps between tip ends of the electrode fingers and tip ends of the dummy electrode fingers and to overlap with at least one of first through third groups in which the first and second groups respectively include the electrode fingers and the dummy electrode fingers located at opposite sides of the gaps in a first direction in which the electrode fingers extend, and the third group includes the electrode fingers located at sides of the gaps in a second direction that crosses the first direction, each of the additional films covering a single gap among the gaps.

2. The surface acoustic wave device according to claim 1, wherein the additional films overlap with at least one of the first and second groups that respectively include the electrode fingers and the dummy electrode fingers located at the opposite sides of the gaps in the first direction, and do not overlap with the electrode fingers located at the sides of the gaps in the second direction.

3. The surface acoustic wave device according to claim 1, wherein the additional films overlap with at least one of the first and second groups within a range of $1.0\lambda$ or less from the tip ends of the electrode fingers and those of the dummy electrode fingers located at the opposite sides of the gaps in the first direction where $\lambda$ is a wavelength of an acoustic wave excited by the pair of comb-type electrodes.

4. The surface acoustic wave device according to claim 1, wherein the additional films include protrusions provided on end portions in the first direction.

5. The surface acoustic wave device according to claim 1, further comprising a protection film that cover the pair of comb-type electrodes, wherein the additional films are provided on the protection film.

6. The surface acoustic wave device according to claim 1, wherein the additional films include a film including any of tantalum oxide, aluminumoxide, silicon oxide, silicon nitride, aluminum nitride, silicon carbide, titanium oxide, silicon and diamond, or a metal film.

7. A filter comprising an input terminal, an output terminal and resonators connected between the input and output terminals, at least one of the resonators including a surface acoustic wave device according to claim 1.

8. The surface acoustic wave device according to claim 1, wherein the additional films overlap with the third group that includes the electrode fingers located at the sides of the gaps in the second direction, and do not overlap with the first and second groups that respectively include the electrode fingers and the dummy fingers located at the opposite sides of the gaps in the first direction.

9. A surface acoustic wave device comprising:
a pair of comb-type electrodes that are provided on a piezoelectric substrate and include electrode fingers and bus bars, the electrode fingers of one of the pair of comb-type electrodes facing one of the bus bars of the other comb-type electrode; and
additional films that are provided to cover gaps between tip ends of the electrode fingers and sides of the bus bars and to overlap with at least one of first through third groups in which the first and second groups respectively include the electrode fingers and the bus bars located at opposite sides of the gaps in a first direction in which the electrode fingers extend, and the third group includes the electrode fingers located at sides of the gaps in a second direction that crosses the first direction, each of the additional films covering a single gap among the gaps.

10. The surface acoustic wave device according to claim 9, wherein the additional films overlap with at least one of the first and second groups that respectively include the electrode fingers and the bus bars located at the opposite sides of the gaps in the first direction, and do not overlap with the electrode fingers located at the sides of the gaps in the second direction.

11. The surface acoustic wave device according to claim 9, wherein the additional films overlap with at least one of the first and second groups within a range of $1.0\lambda$ or less from the tip ends of the electrode fingers and the sides of the bus bars located at the opposite sides of the gaps in the first direction where $\lambda$ is a wavelength of an acoustic wave excited by the pair of comb-type electrodes.

12. The surface acoustic wave device according to claim 9, wherein the additional films include protrusions provided on end portions in the first direction.

13. The surface acoustic wave device according to claim 9, further comprising a protection film that cover the pair of comb-type electrodes, wherein the additional films are provided on the protection film.

14. The surface acoustic wave device according to claim 9, wherein the additional films include a film including any of tantalum oxide, aluminum oxide, silicon oxide, silicon nitride, aluminum nitride, silicon carbide, titanium oxide, silicon and diamond, or a metal film.

15. The surface acoustic wave device according to claim 9, wherein the additional films overlap with the third group that includes the electrode fingers located at the sides of the gaps in the second direction, and do not overlap with the first and second groups that respectively include the electrode fingers and the bus bars located at the opposite sides of the gaps in the first direction.

16. A filter comprising an input terminal, an output terminal and resonators connected between the input and output terminals, at least one of the resonators including a surface acoustic wave device including:
a pair of comb-type electrodes that are provided on a piezoelectric substrate and include electrode fingers and bus bars, the electrode fingers of one of the pair of comb-type electrodes facing one of the bus bars of the other comb-type electrode; and
additional films that are provided to cover gaps between tip ends of the electrode fingers and sides of the bus bars and to overlap with at least one of first through third groups in which the first and second groups respectively include the electrode fingers and the bus bars located at opposite sides of the gaps in a first direction in which the electrode fingers extend, and the third group includes the electrode fingers located at sides of the gaps in a second direction that crosses the first direction, each of the additional films covering a single gap among the gaps.

17. A surface acoustic wave device comprising:
a pair of comb-type electrodes that are provided on a piezoelectric substrate and include electrode fingers and dummy electrode fingers, the electrode fingers of one of the pair of comb-type electrodes facing the dummy electrode fingers of the other comb-type electrode; and
additional films that are provided to cover gaps between tip ends of the electrode fingers and tip ends of the dummy electrode fingers and to overlap with at least one of first through third groups in which the first and second groups respectively include the electrode fingers and the dummy electrode fingers located at opposite sides of the gaps in a first direction in which the electrode fingers extend, and the third group includes the electrode fingers located at sides of the gaps in a second direction that crosses the first direction, wherein the additional films include protrusions provided on end portions in the first direction.

* * * * *